United States Patent
Kim et al.

(10) Patent No.: US 10,649,849 B2
(45) Date of Patent: May 12, 2020

(54) MEMORY DEVICE INCLUDING DETECTION CLOCK PATTERN GENERATOR FOR GENERATING DETECTION CLOCK OUTPUT SIGNAL INCLUDING RANDOM DATA PATTERN

(71) Applicant: SAMSUNG ELECTRONICS CO., LTD., Suwon-si, Gyeonggi-do (KR)

(72) Inventors: Yong-Hun Kim, Hwaseong-si (KR); Su-Yeon Doo, Seoul (KR); Dong-Seok Kang, Suwon-si (KR); Hye-Jung Kwon, Seoul (KR); Young-Ju Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 185 days.

(21) Appl. No.: 15/938,092

(22) Filed: Mar. 28, 2018

(65) Prior Publication Data
US 2019/0018737 A1  Jan. 17, 2019

(30) Foreign Application Priority Data

Jul. 14, 2017 (KR) .................. 10-2017-0089851
Jul. 27, 2017 (KR) .................. 10-2017-0095718
Sep. 5, 2017 (KR) .................. 10-2017-0113355

(51) Int. Cl.
*G06F 11/07* (2006.01)
*G06F 11/14* (2006.01)
(Continued)

(52) U.S. Cl.
CPC ...... *G06F 11/1446* (2013.01); *G06F 11/1004* (2013.01); *H03K 3/84* (2013.01); *G06F 2201/82* (2013.01); *H03K 3/0315* (2013.01)

(58) Field of Classification Search
CPC .................. G06F 11/0703; G06F 11/1004
(Continued)

(56) References Cited

U.S. PATENT DOCUMENTS 4,878,233 A   10/1989   Hayashi
7,652,516 B2   1/2010   Bourstein et al.
(Continued)

FOREIGN PATENT DOCUMENTS

CN   102737727       10/2012
JP   62014397 A  *   1/1987
(Continued)

OTHER PUBLICATIONS

Search Report and Written Opinion dated May 12, 2018 in Corresponding Singapore Application. No. 10201803694X.

*Primary Examiner* — Chae M Ko
(74) *Attorney, Agent, or Firm* — F. Chau & Associates, LLC

(57) ABSTRACT

A memory device includes an output pin, a mode register, a signal generator configured to generate a detection clock output signal including one of a random data pattern and a hold data pattern in response to first and second control signals from the mode register, and output the detection clock output signal through the output pin. The random data pattern includes pseudo-random data generated by the memory device. The hold data pattern is a fixed pattern pre stored in the memory device. The detection clock output signal is used for a clock and data recovery operation.

19 Claims, 37 Drawing Sheets

(51) Int. Cl.
*G06F 11/10* (2006.01)
*H03K 3/84* (2006.01)
*H03K 3/03* (2006.01)

(58) Field of Classification Search
USPC .......................................................... 714/15
See application file for complete search history.

(56) References Cited

U.S. PATENT DOCUMENTS

| | | | |
|---|---|---|---|
| 8,023,553 | B2 | 9/2011 | Ko et al. |
| 8,169,851 | B2 | 5/2012 | Chou |
| 8,495,440 | B2 | 7/2013 | Dearth |
| 9,323,957 | B2 | 4/2016 | A/L Krishnasamy et al. |
| 10,236,045 | B2 * | 3/2019 | Doo ........................ G11C 8/18 |
| 2001/0014053 | A1 * | 8/2001 | Li ........................ G11C 7/1051 |
| | | | 365/230.05 |
| 2007/0067374 | A1 | 3/2007 | Iketani et al. |
| 2007/0239379 | A1 * | 10/2007 | Newcomb ........... G06F 13/4243 |
| | | | 702/89 |
| 2007/0283297 | A1 * | 12/2007 | Hein ........................ G11C 7/22 |
| | | | 716/100 |
| 2008/0098253 | A1 * | 4/2008 | Lee .................. G01R 31/31937 |
| | | | 713/503 |
| 2008/0112255 | A1 | 5/2008 | Nygren et al. |
| 2008/0130810 | A1 * | 6/2008 | Bae ........................ H04L 7/0337 |
| | | | 375/355 |
| 2008/0225603 | A1 * | 9/2008 | Hein ........................ G11C 7/1051 |
| | | | 365/189.05 |
| 2009/0119419 | A1 * | 5/2009 | Bae ..................... G06F 13/4243 |
| | | | 710/4 |
| 2011/0019787 | A1 * | 1/2011 | Nygren ................. G11C 7/1045 |
| | | | 375/371 |
| 2012/0216095 | A1 * | 8/2012 | Ha ....................... G06F 11/1004 |
| | | | 714/758 |
| 2014/0086002 | A1 * | 3/2014 | Doo ........................ G11C 8/18 |
| | | | 365/233.11 |
| 2017/0004869 | A1 | 1/2017 | Shin et al. |
| 2017/0192830 | A1 | 7/2017 | Bai et al. |
| 2018/0006849 | A1 * | 1/2018 | Jang ........................ H03L 7/081 |

FOREIGN PATENT DOCUMENTS

| | | |
|---|---|---|
| KR | 10-0856123 | 8/2008 |
| KR | 1020140039948 | 4/2014 |

* cited by examiner

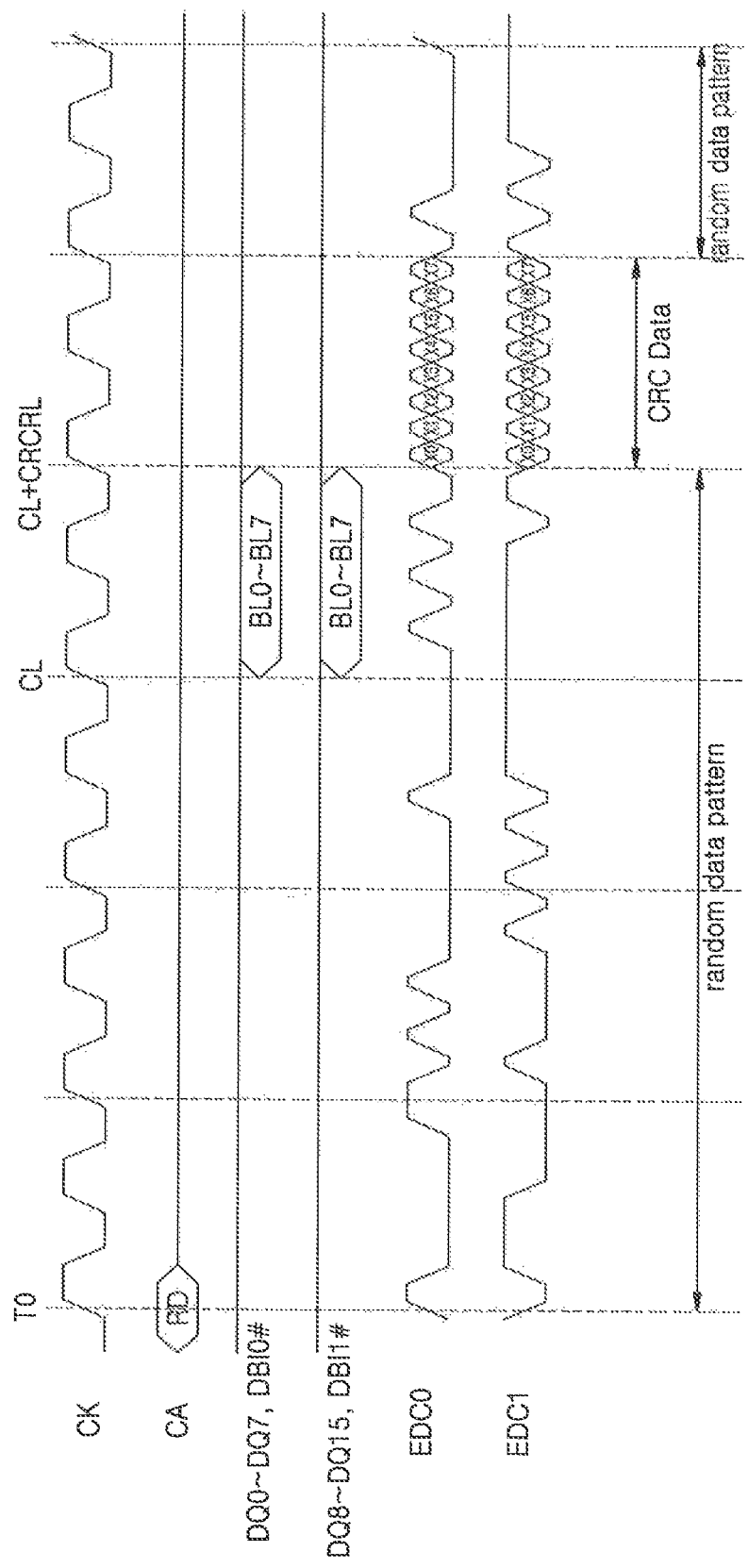

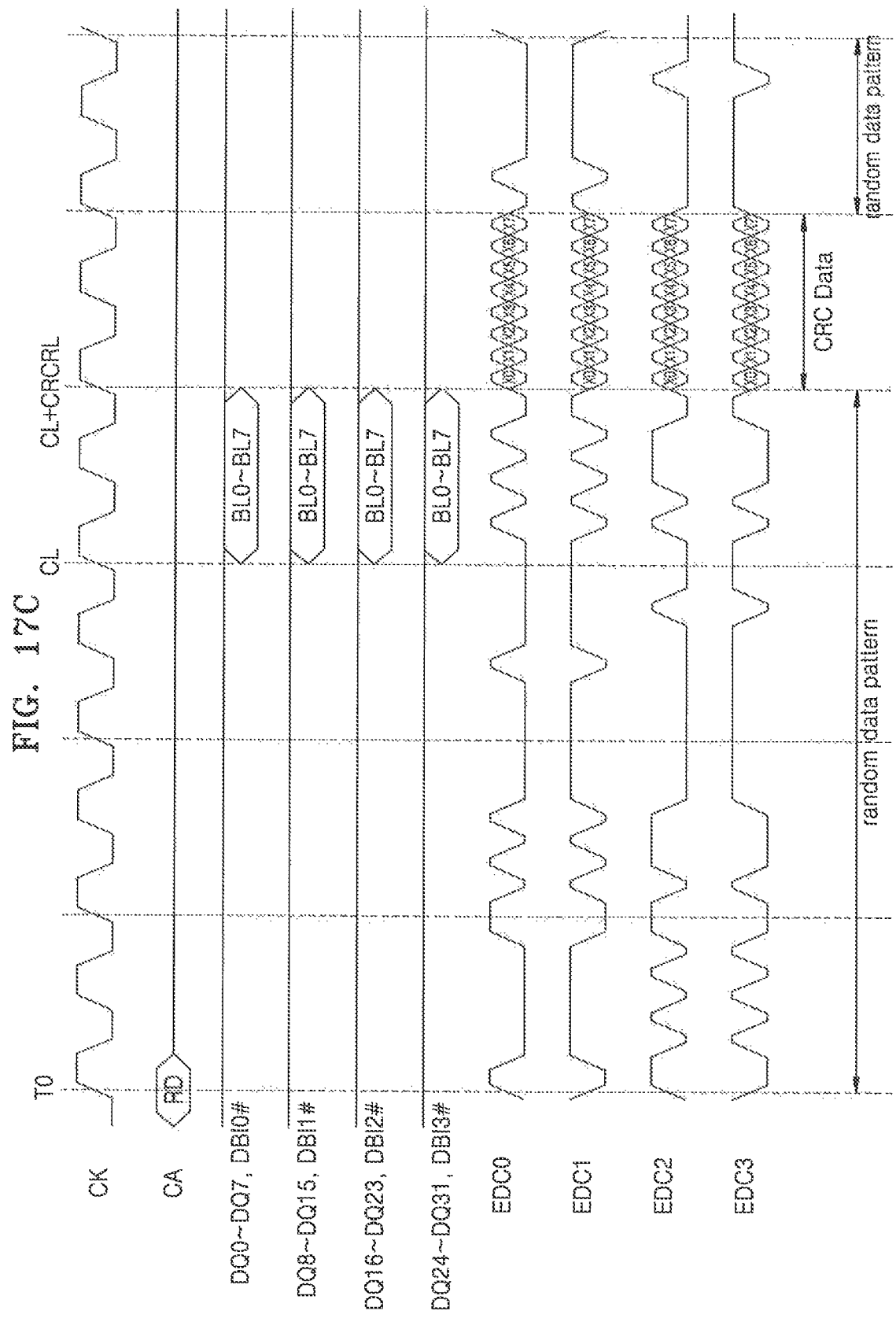

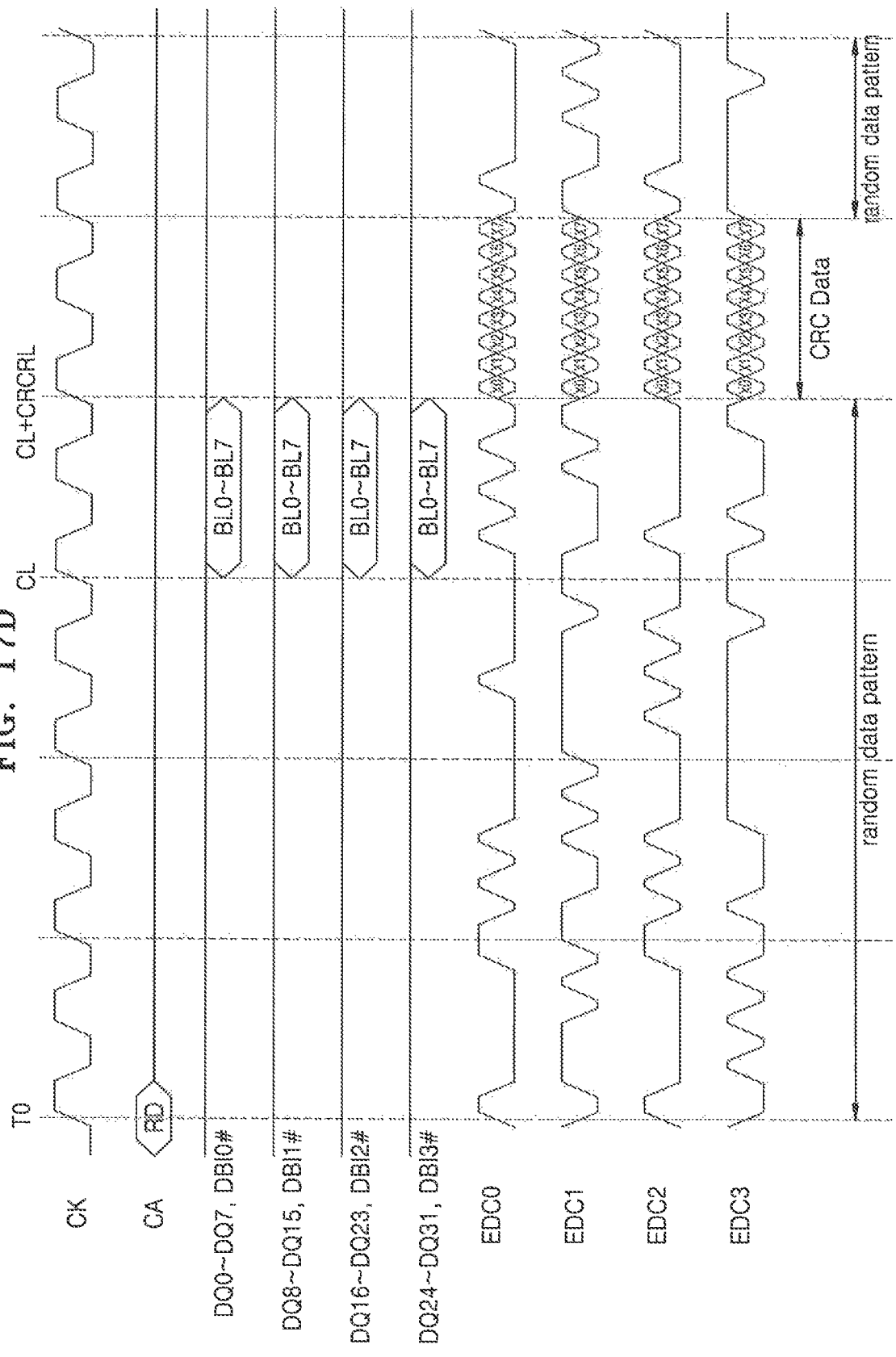

MEMORY DEVICE INCLUDING DETECTION CLOCK PATTERN GENERATOR FOR GENERATING DETECTION CLOCK OUTPUT SIGNAL INCLUDING RANDOM DATA PATTERN

CROSS-REFERENCE TO RELATED APPLICATIONS

This application claims the benefit of Korean Patent Application No. 10-2017-0089851 filed on Jul. 14, 2017, Korean Patent Application No. 10-2017-0095718 filed on Jul. 27, 2017, and Korean Patent Application No. 10-2017-0113355 filed on Sep. 5, 2017, in the Korean Intellectual Property Office, the disclosures of which are incorporated by reference in their entireties herein.

BACKGROUND

1. Technical Field

The inventive concept relates to a memory device, and more particularly, to a memory device including a detection clock pattern generator that provides a detection clock output signal for aligning data of a dynamic random-access memory (DRAM) with a clock signal of a graphics processing unit (GPU) in a clock data recovery operation.

2. Discussion of Related Art

A DRAM may be used as a graphic data memory of an electronic device. A RAM is a type of random access semiconductor memory that stores each bit of data in a separate tiny capacitor within an integrated circuit. A controller of the electronic device transmits a command to the DRAM in synchronization with a command clock, and transfers data to the DRAM in synchronization with a data clock. A GPU is a specialized electronic circuit designed to rapidly manipulate and alter memory to accelerate certain processes such as the creation of images in a frame buffer intended for output to a display device. The GPU aligns data received from the DRAM with a clock of the GPU through a clock data recovery (CDR) operation.

SUMMARY

At least one embodiment of the inventive concept provides a memory device including a detection clock pattern generator for providing, as a random data pattern, a detection clock output signal used for a clock data recovery operation.

According to an exemplary embodiment of the inventive concept, a memory device is provided including an output pin, a mode register, and a signal generator. The signal generator is configured to generate a detection clock output signal including one of a random data pattern and a hold data pattern in response to a first control signal and a second control signal from the mode register, and output the detection clock output signal through the output pin. The random data pattern includes pseudo-random data generated by the memory device. The hold data pattern is a fixed pattern pre-stored in the memory device. The detection clock output signal is used for a clock data recovery operation.

According to an exemplary embodiment of the inventive concept, a memory device is provided including an output pin, a mode register, and a signal generator. The signal generator is configured to generate training data comprising a random data pattern in response to a first control signal output from the mode register during a first mode, and output the training data through the output pin at one of a first rate and a second rate different from the first rate based on a second control signal output from the mode register. The random data pattern includes pseudo-random data generated by the memory device. The training data is used for a clock and data recovery operation.

According to an exemplary embodiment of the inventive concept, a memory device is provided including first and second EDC pins and a signal generator. The signal generator is configured output a first random data pattern through the first EDC pin and output as second random data pattern through the second EDC pin, during a first period; calculate first cyclic redundancy check (CRC) data based on first data; calculate second CRC data based on second data; and output the first CRC data through the first EDC pin and the second CRC data through the second EDC pin, during a second period after the first period. The first and second random data patterns include pseudo-random data generated by the memory device. The random data patterns are used for a clock data recovery operation.

BRIEF DESCRIPTION OF THE DRAWINGS

Embodiments of the inventive concept will be more clearly understood from the following detailed description taken in conjunction with the accompanying drawings in which:

FIGS. 14 and 15A to 15C are diagrams illustrating a graphics memory system including a memory device, according to an exemplary embodiment of the inventive concept;

FIGS. 16 and 17A to 17D are diagrams illustrating a graphics memory system including a memory device, according to an exemplary embodiment of the inventive concept.

DETAILED DESCRIPTION OF THE EXEMPLARY EMBODIMENTS

Figure 1:
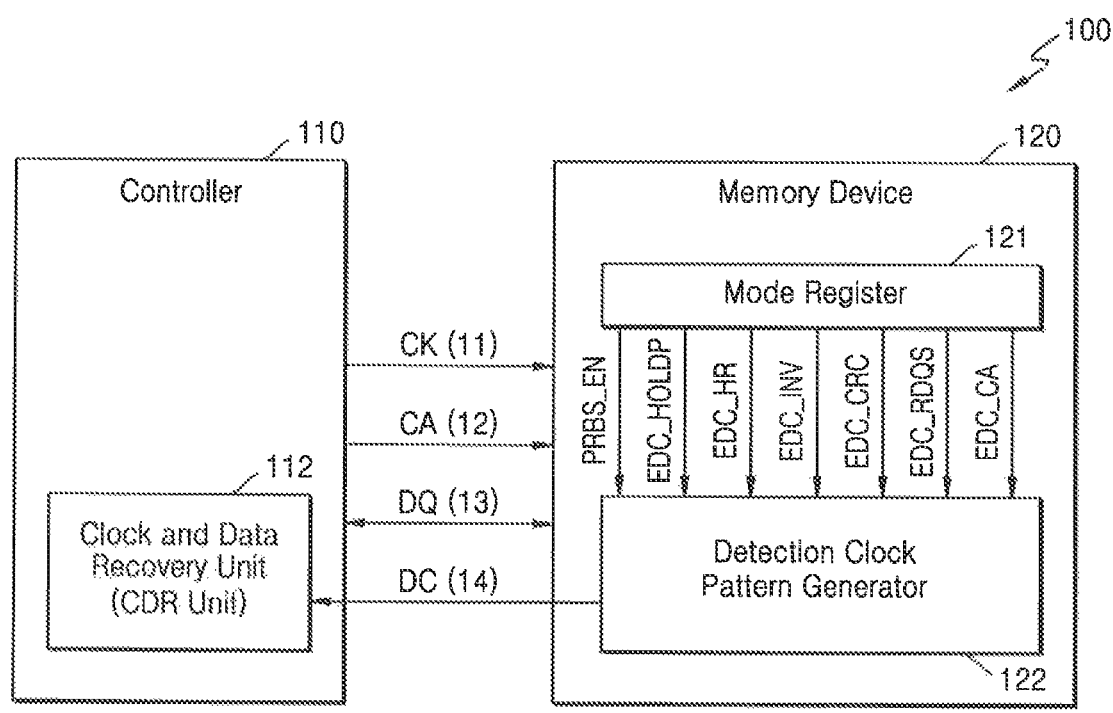
FIG. 1 is a block diagram of a memory system including a memory device, according to an exemplary embodiment of the inventive concept.

FIG. 1 is a block diagram of a memory system 100 including a memory device, according to an exemplary embodiment of the inventive concept.

Referring to FIG. 1, the memory system 100 includes a controller 110 (e.g., a control circuit) and a memory device 120. The controller 110 may be implemented with a central processing unit (CPU) or a graphic processing unit (GPU), and may include a computing device a CPU core) and a cache memory. The memory device 120 may be a clock synchronous dynamic random-access memory (DRAM) such as a synchronous DRAM (SDRAM). For example, the memory device 120 may be a graphics double data rate (GDDR) SDRAM. According to embodiments, the memory device 120 may be a memory device such as a double data rate (DDR) SDRAM, a low power double data rate (LPDDR) SDRAM, or a Rambus dynamic random-access memory (RDRAM).

A clock signal line 11, a command address bus 12, and a data bus 13 are connected between the controller 110 and the memory device 120. A main clock signal CK generated by the controller 110 is output to the memory device 120 through the clock signal line 11. For example, an inverted main clock signal CKB may be provided as a continuous alternating inverted signal, together with the main clock signal CK. For example, the main clock signal CK includes a plurality of pulses that repeat at a given frequency and the inverted main clock signal CKB is an inverted version of the main clock signal CK. As a pair, the main clock signal CK and the inverted main clock signal CKB may improve timing accuracy since rising/falling edges may be detected based on intersection points thereof.

According to an embodiment, the main clock signal CK is alone provided as a continuous alternating signal to the clock signal line 11. The main clock signal CK can be compared with a reference voltage Vref to identify rising/falling edges of the main clock signal CK. When noise fluctuation occurs in the reference voltage Vref, a shift may occur in the detection of the main clock signal CK, and thus timing accuracy may be lower when using the main clock signal CK and the inverted main clock signal CKB as a pair.

Accordingly, it is desirable that the clock signal line 11 transmits continuous alternating signals which complement each other, by using the pair of the main clock signal CK and the inverted main clock signal CKB. In this case, the clock signal line 11 may include two signal lines for transmitting the main clock signal CK and the inverted main clock signal CKB. While the main clock signal CK and the inverted main clock signal CKB are two separate signals, for convenience of description, the main clock signal pair CK and CKB will be collectively referred to as the main clock signal CK.

According to an embodiment, the memory system 100 may support data communication by using various clock signals, including a data clock signal WCK, in addition to the main clock signal CK. For example, the frequency of the data clock signal WCK may be two or four times the frequency of the main clock signal CK.

A command CMD generated by the controller 110 is output to the memory device 120 via the command address bus 12. An address signal generated by the controller 110 is output to the memory device 120 via the command address bus 12. The command CMD or the address signal may be issued by a combination of command address signals received in a time-sequential manner via the command address bus 12. For example, the command CMD could be a read command or a write command, and the address signal could indicate a location in the memory device 120 to read data from based on the read command or write data to based on the write command.

In a data interface between the controller 110 and the memory device 120, data DQ is transmitted via the data bus 13. For example, write data DQ corresponding to a burst length, provided by the controller 110, may be transferred to the memory device 120 via the data bus 13. The read data DQ corresponding to the burst length BL read out from the memory device 120 can be transferred to the controller 110 through the data bus 13. The write data DQ or read data DQ may be transmitted and received through data input/output pins (hereinafter referred to as "DQ pins") of the memory device 120. The pins may be electrical interconnections to an integrated circuit, and includes, for example, a pad or other electrical contact on an integrated circuit.

A data interface speed between the controller 110 and the memory device 120 be relatively high. For example, the high data interface speed allows the controller 110 and the memory device to handle high-speed graphics or games.

Data DQ output from the memory device 120 to the controller 110 is received by the controller 110 in synchronization with a clock signal. The controller 110 performs a data synchronization operation to synchronize the output data DQ of the memory device 120 with the clock signal. In an exemplary embodiment, the data synchronization operation includes a clock data recovery operation of adjusting a phase so that an edge of the clock signal of the controller 110 is in the middle of the output data DQ of the memory device 120. The clock data recovery operation may be performed in a clock data recovery unit 112 (hereinafter referred to as "CDR unit") by using a detection clock output signal DC provided by the memory device 120. The clock data recovery unit 112 may be implemented by a clock data recovery circuit.

The memory device 120 includes a mode register 121 that provides a plurality of operation options. The mode register 121 may set various functions, characteristics, and modes of the memory device 120. The mode register 121 may set specific operating modes such as a CAS latency, a burst length, an error detection code scheme, a cyclic redundancy check (CRC), a CRC latency, a write latency, and a data bus inversion (DBI). For example, the mode register 121 may include one or more parameters that indicate the burst length is set to a particular value, a flag that indicates whether the CRC is to be performed, a parameter that indicates a particular error detection code scheme that is to be performed, etc.

The mode register 121 may provide a plurality of control signals, i.e., first to seventh control signals PRBS_EN, EDC_HOLDP, EDC_HR, EDC_INV, EDC_CRC, EDC_RDQS, and EDC_CA, which control an operation of the detection clock pattern generator 122 (e.g., a signal generator). The control signals may be provided based on parameters stored within the mode register 121.

The states of the first control signal PRBS_EN determines whether the detection clock pattern generator 122 generates the detection clock output signal DC including a random data pattern or including a hold data pattern. For example, when the first control signal PRBS_EN is a first logic level (e.g., logic high), the detection clock pattern generator 122 generates the detection clock output signal DC including the random data pattern. When the first control signal PRBS_EN is a second logic level (e.g., logic low), the detection clock pattern generator 122 may generate the detection clock output signal including a hold data pattern. For example, the detection clock output signal includes the hold data pattern when the second control signal EDC_HOLDP is a first logic level (e.g., logic high). In an exemplary embodiment, when the second control signal EDC_HOLDP is a second logic level (e.g., logic low) and the first control signal PRBS_EN is logic low, the detection clock output signal is not output by the detection clock pattern generator 122. The detection clock output signal is used for a clock data recovery operation by the clock and data recovery unit 112. Thus, the random data pattern or the hold data pattern may be used for a clock data recovery operation. The random data pattern is generated randomly or pseudo-randomly, whereas the hold data pattern is a static pattern. When two consecutive random data patterns are output to a same pin, they differ from one another. However, when two consecutive hold data patterns of a certain type are output to a same pin, they are the same as one another.

The second control signal EDC_HOLDP is a signal set such that a hold data pattern is output to a detection clock output signal (DC) pin (hereinafter referred to as "DC pin") instead of the random data pattern generated by the detection clock pattern generator 122. The second control signal EDC_HOLDP may allow a hold data pattern provided from the mode register 121 to be output to the DC pin. For example, by the second control signal EDC_HOLDP, the hold data pattern may be set to any one of patterns 0000, 0001, . . . , and 1111. When the second control signal EDC_HOLDP is set to 0001, the detection clock output signal DC may be repeatedly output as the patterns 0001, 0001, and 0001. According to an embodiment, the second control signal EDC_HOLDP related to the hold data pattern may be provided when the first control signal PRBS_EN is logic low.

The third control signal EDC_HR is a signal set such that a random data pattern of the detection clock output signal DC generated by the detection clock pattern generator 122 is output at a first rate or a second rate that is $1/2^n$ times the first rate, where n is a natural number. The first rate may be set such that the random data pattern is output in 1-bit units, and the second rate may be set such that the random data pattern is output in $2^n$-bit units such as 2-bit units, 4-bit units, or 8-bit units. For example, when the third control signal EDC_HR is a first logic level. (e.g., logic low), the random data pattern of the detection clock output signal DC output from the detection clock pattern generator 122 is output at the first rate. When the third control signal EDC_HR is a second logic level (e.g., logic high), the random data pattern of the detection clock output signal DC output from the detection clock pattern generator 122 is output at the second rate.

According to an embodiment, when a hold data pattern is output to the DC pin, the hold data pattern is output at the first rate if the third control signal EDC_HR is logic low, and output at the second rate if the third control signal EDC_HR is logic high.

The fourth control signal EDC_INV is a signal set such that a random data pattern of the detection clock output signal DC output from the detection clock pattern generator 122 is inverted and an inverted random data pattern is output. For example, when the fourth control signal EDC_INV is a first logic level (e.g., logic low), the random data pattern of the detection clock output signal DC output from the detection clock pattern generator 122 is output without inversion. When the fourth control signal EDC_INV is a second logic level (e.g., logic high), the random data pattern of the detection clock output signal DC output from the detection clock pattern generator 122 is inverted and an inverted random data pattern is output.

According to an embodiment, when a hold data pattern is output to the DC pin, the hold data pattern is output to the DC pin without inversion if the fourth control signal EDC_INV is the first logic level (e.g., logic low), and the hold data pattern is inverted and an inverted hold data pattern is output to the DC pin, if the fourth control signal EDC_INV is the second logic level (e.g., logic high).

The fifth control signal EDC_CRC is a signal set to output a CRC code generated by the detection clock pattern generator 122 to the DC pin. In an embodiment, the detection clock pattern generator 122 is configured to detect an error in data DQ in a data access mode by the controller 110 in order to improve the data reliability of the memory device 120. In an embodiment, the detection clock pattern generator 122 generates a CRC code for read and/or write data DQ in response to the fifth control signal EDC_CRC and transmits the CRC code to the controller 110 via the DC pin. The controller 110 may determine whether there is an error in the data DQ, based on the transmitted CRC code and reissue a read command and/or a write command. For example, if the controller 110 is attempting to read data from the memory device 120, and the controller 110 determines that the read has failed based on the received CRC code, the controller 110 will re-transmit the read command. For example, if the controller 110 is attempting to write data to the memory device 120, and the controller 110 determines that the write has failed based on the received CRC code, the controller 110 will re-transmit the write command.

According to an embodiment, when a CRC code is output to the DC pin, the CRC code is output at a first rate if the third control signal EDC_HR is logic low, and output at a second rate (e.g., $1/2^n$ times the first rate, where n is a natural number), if the third control signal EDC_HR is logic high. In an embodiment, when the CRC code is output to the DC pin, the first control signal PRBS_EN and the second control signal EDC_HOLDP are both set to the second logic level (logic low).

The sixth control signal EDC_RDQS is set to output a read data strobe signal RDQS of the memory device 120 to the DC pin. The read data strobe signal RDQS may be provided to the controller 110 during a read data strobe mode. The controller 110 may receive the read data strobe signal RDQS and the read data DQ output from the memory device 120 and latch the read data DQ by using the read data strobe signal RDQS.

According to an embodiment, when the read data strobe signal RDQS is output to the DC pin, the read data strobe signal RDQS is output at a first rate if the third control signal EDC_HR is a first logic level (e.g., logic low), and output at a second rate (e.g., $1/2^n$ times the first rate, where n is a natural number), if the third control signal EDC_HR is a second logic level (e.g., logic high).

The seventh control signal EDC_CA is set to output command address (CA) data (hereinafter referred to as "CA data") to the DC pin of the memory device 120. The CA data may be provided to the controller 110, and the controller 110 may perform a command address (CA) training operation (hereinafter referred to as "CA training operation") by using the CA data. The CA training operation refers to an operation of performing synchronization so that the middle of a window of a command address CA transmitted from the controller 110 to the memory device 120 is at an edge of the main clock signal CK. The command address CA may be used by the controller 110 to set the values of the mode register 121 to set the memory device 120 with a specific operating mode such as CAS latency, a burst length, an error detection scheme, a cyclic redundancy check (CRC), a CRC latency, a write latency, and a data bus inversion (DBI).

According to an embodiment, when the CA data is output to the DC pin, the CA data is output at a first rate if the third control signal EDC_HR is a first logic level (e.g., logic low), and is output at a second rate (e.g., $1/2^n$ times the first rate, where n is a natural number), if the third control signal EDC_HR is a second logic level (e.g., logic high).

The memory device 120 includes the detection clock pattern generator 122 that generates a detection clock output signal DC. The detection clock pattern generator 122 may generate a detection clock output signal DC including a random data pattern. The memory device 120 may transmit the detection clock output signal DC including the random data pattern to the controller 110 via a signal line 14 connected to a dedicated pin for outputting the detection clock output signal DC. The CDR unit 112 of the controller 110 may perform a clock data recovery operation by using the detection clock output signal DC including the random data pattern similar to actual data. Accordingly, the CDR unit 112 may reduce a phase offset and a locking time in the clock data recovery operation.

While FIG. 1 shows the mode register 121 capable of sending first to seventh control signals PRBS_EN, EDC_HOLDP, EDC_HR, EDC_INV, EDC_CRC, EDC_RDQS, and EDC_CA in an alternate embodiment, the mode register 121 generates and outputs fewer than these seven control signals. For example, in a first alternate embodiment, the mode register 121 only generates and outputs the first to third control signals PRBS_EN, EDC_HOLDP, and EDC_HR. For example, in a second alternate embodiment, the mode register 121 only outputs the first to third control signals PRBS_EN, EDC_HOLDP, and EDC_HR, and one of the fourth through seventh control signals EDC_INV, EDC_CRC, EDC_RDQS, and EDC_CA.

Figure 2A:
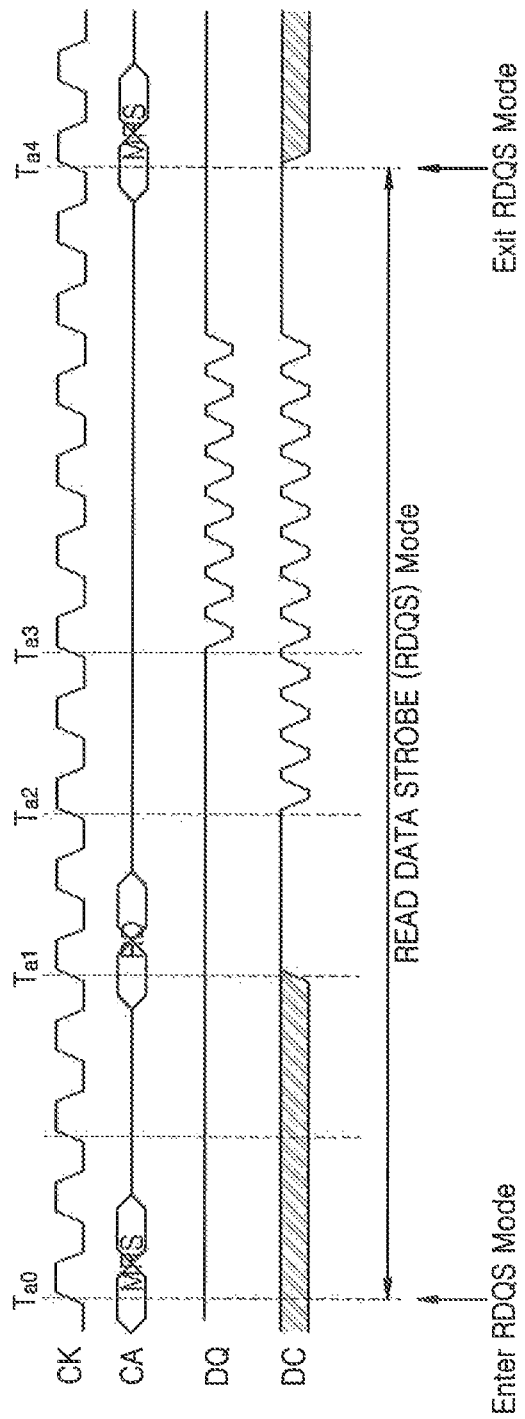
FIGS. 2A and 2B are timing diagrams illustrating an operation of a memory device, according to an exemplary embodiment of the inventive concept.
Figure 2B:
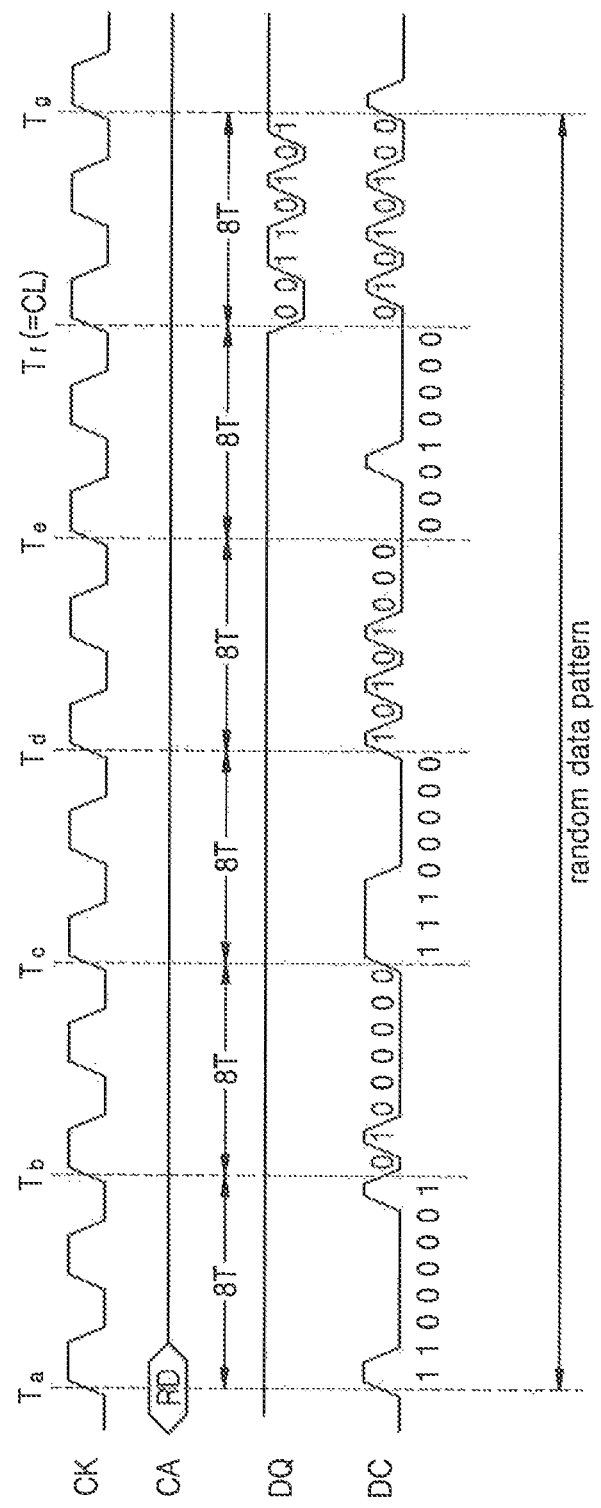

FIGS. 2A and 2B are timing diagrams illustrating an operation of a memory device according to an exemplary embodiment of the inventive concept. FIG. 2A illustrates an example in which a read data strobe signal RDQS is output to the DC pin of the memory device 120, and FIG. 2B illustrates an example in which a random data pattern is output.

Referring to FIG. 2A in conjunction with FIG. 1, a main clock signal CK is received from the time Ta0. At the time Ta0, a mode register setting command MRS synchronized with a rising edge of the main clock signal CK is received by the memory device 120 and the memory device 120 enters a read data strobe mode (hereinafter referred to as "RDQS mode"). And then, at the time Ta4, a mode register setting command MRS synchronized with a rising edge of the main clock signal CK is received by the memory device 120 and the memory device 120 exits the RDQS mode.

During the RDQS mode, at the time Ta3 at which a read latency RL set in the memory device 120 has elapsed after a read command RD is applied at the time Ta1, the memory device 120 outputs read data DQ. 8-bit data corresponding to a burst length of 8 (BL8) may be output as the read data DQ. Before the read data DQ is output, a fixed clock-like pattern is output to the DC pin at the time Ta2. The fixed clock-like pattern and the read data DQ, output from the memory device 120, are provided to the controller 110 of FIG. 1, and the fixed clock-like pattern may act as the read data strobe signal RDQS. The controller 110 may use the read data strobe signal RDQS to latch the read data DQ. While the above example shows use of 8-bit data, embodiments of the inventive concept are not limited thereto, as a lower or higher burst length may be used.

Referring to FIG. 2B in conjunction with FIG. 1, a main clock signal CK is received by memory device 120.

The main clock signal CK is received from the time Ta. At the time Ta, a read command RD synchronized with a rising edge of the main clock signal CK is received by the memory device 120.

At the time Tf at which a column address strobe (CAS) latency CL set in the memory device 120 has elapsed after a read command RD is applied at the time Ta, the memory device 120 outputs read data DQ. 8-bit data corresponding to BL8, for example, 00110101, may be output as the read data DQ. When an output time period of 1-bit data is defined as "T", read data DQ of BL8 may be output for 8T. The 8T may be set as a data unit interval of the read data DQ. During the data unit interval 8T from the time Tf to the time Tg, the read data DQ of BL8 is output. Hereinafter, 8T will be described as a data unit interval, and T will be described as a 1-bit data unit.

The detection clock output signal DC that is output from the detection clock pattern generator 122 may be output as a different data pattern, i.e., a random data pattern, for each data unit interval of 8T. For example, the detection clock output signal DC may be output as a data pattern 11000001 during 8T from the time Ta to the time Tb. The detection clock output signal DC may be output as a data pattern 01000000 during 8T from the time Tb to the time Tc, may be output as a data pattern 11100000 during 8T from the time Tc to the time Td, may be output as a data pattern 10101000 during 8T from the time Td to the time Te, and may be output as a data pattern 00010000 during 8T from the time Te to the time Tf. In addition, during 8T from the time Tf to the time Tg for which the read data DQ is output, the detection clock output signal DC may be output as a data pattern 01010100.

The detection clock output signal DC output from the memory device 120 may be output as a random data pattern and transmitted to the controller 110. The detection clock output signal DC, which is provided from the detection clock pattern generator 122, may be generated as a pseudo-random data pattern rather than a completely random data pattern by the operation of a pseudo random bit sequence generator 400 (see FIG. 3) in the detection clock pattern generator 122. This is because, when the number of flip-flops constituting the pseudo random bit sequence generator 400 is n (where n is a natural number), $2^n-1$ random data patterns are repeatedly generated.

Figure 3A:
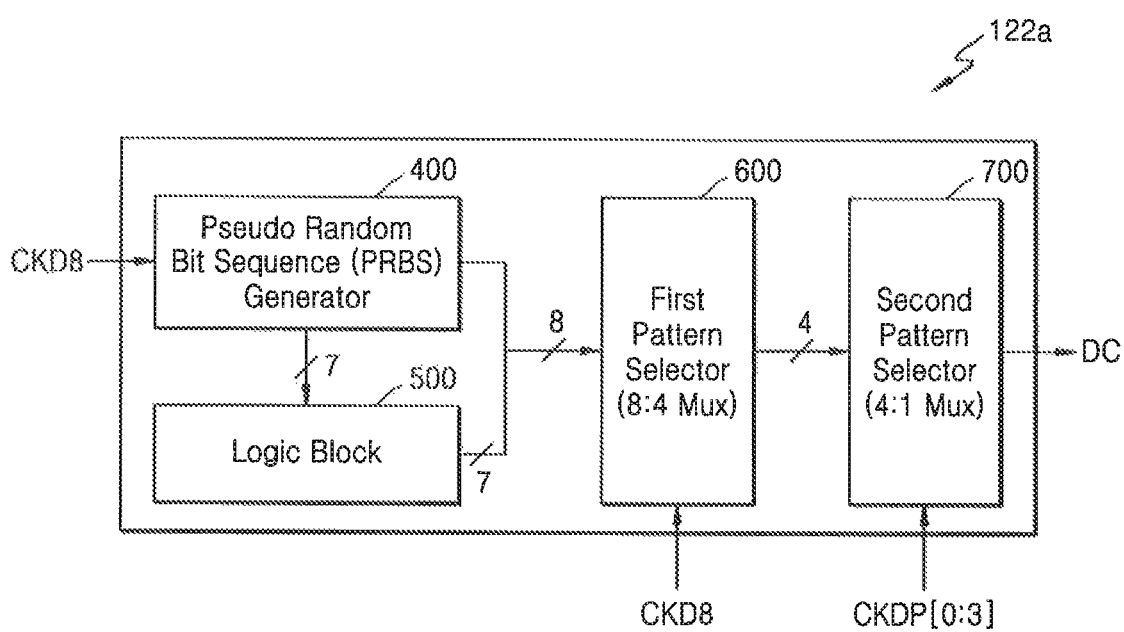
FIGS. 3A and 3B are diagrams illustrating a detection clock pattern generator according to an exemplary embodiment of an inventive concept.
Figure 3B:
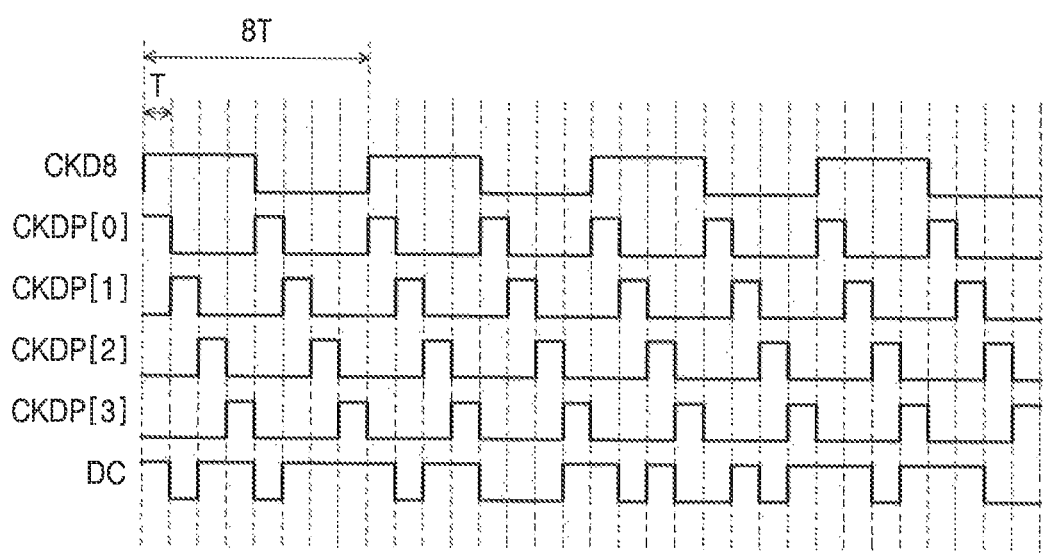

FIGS. 3A and 3B are diagrams illustrating a detection clock pattern generator according to an exemplary embodiment of an inventive concept. FIG. 3A is a block diagram of the detection clock pattern generator 122 of FIG. 1, and FIG. 3B is a timing diagram illustrating operations of the detection clock pattern generator 122.

Referring to FIG. 3A, a detection clock pattern generator 122a, which corresponds to the detection clock pattern generator 122 of FIG. 1, generates a detection clock output signal based on a state of the first control signal PRBS_EN provided by the mode register 121 of FIG. 1. The detection clock pattern generator 122a includes the pseudo random bit sequence generator 400 (hereinafter referred to as "PRBS generator"), a logic block 500 (e.g., a logic circuit), a first pattern selector 600 (e.g., one or more multiplexers), and a second pattern selector 700 (e.g., one or more multiplexers).

The PRBS generator 400 may generate a plurality of random bit signals $a_n$ to $a_{n+6}$ in response to a first clock signal CKD8. The plurality of random bit signals $a_n$ to $a_{n+6}$ are provided to the logic block 500 and the first pattern selector 600. The PRBS generator 400 may include a plurality of flip-flops and an exclusive-OR gate. The first clock signal CKD8 may be an internal clock signal generated based on the main clock signal CK in the memory device 120. According to an embodiment, the first clock signal CKD8 is an internal clock signal driven based on a data clock signal WCK. The first clock signal CK8D may be generated as a clock signal with a data unit interval 8T set to one clock cycle and having a 50% duty cycle.

In an embodiment, the logic block 500 receives the random bit signals $a_n$ to $a_{n+6}$ and selectively performs an exclusive-OR operation on the random bit signals $a_n$ to $a_{n+6}$ to generate a plurality of logic output signals $a_{n+16}$, $a_{n+32}$, $a_{n+48}$, $a_{n+64}$, $a_{n+80}$, $a_{n+96}$, and $a_{n+112}$. The logic block 500 may include a plurality of exclusive-OR gates. The logic output signals $a_{n+16}$, $a_{n+32}$, $a_{n+48}$, $a_{n+64}$, $a_{n+80}$, $a_{n+96}$, and $a_{n+112}$ are provided to the first pattern selector 600.

The first pattern selector 600 receives the random bit signal $a_n$ of the PRBS generator 400 and the logic output signal $a_{n+16}$, $a_{n+32}$, $a_{n+48}$, $a_{n+64}$, $a_{n+80}$, $a_{n+96}$, and $a_{n+112}$ of the logic block 500 and generates a plurality of pattern signals $z_0$, $z_1$, $z_2$, and $z_3$ in response to the first clock signal CKD8. The first pattern selector 600 may be implemented with a plurality of multiplexers. The pattern signals $z_0$, $z_1$, $z_2$, and $z_3$ are provided to the second pattern selector 700.

The second pattern selector 700 receives the pattern signals $z_0$, $z_1$, $z_2$, and $z_3$ and outputs a pattern signal, selected in response to second clock signals CKDP[0:3] from among the pattern signals $z_0$, $z_1$, $z_2$, and $z_3$, as the detection clock output signal DC. The second pattern selector 700 may be implemented with a single multiplexer. Each of the second clock signals CKDP[0:3] may be generated as a clock signal having a clock cycle of 4T, which is half the data unit interval 8T, and having a 25% duty cycle.

Referring to FIG. 3B, the first clock signal CKD8 having a period of the data unit interval 8T and the second clock signals CKDP[0:3] having a period of 4T that is half the data unit interval 8T are provided. Each of the second clock signals CKDP[0:3] may be provided as a pulse signal having a high level interval of T. The second clock signal CKDP[0] may be shifted by based on the rising edge of the second clock signal CKDP[0] to thereby provide the second clock signal CKDP[1], the second clock signal CKDP[1] may be shifted by T based on the rising edge of the second clock signal CKDP[1] to thereby provide the second clock signal CKDP[2], and the second clock signal CKDP[2] may be shifted by T based on the rising edge of the second clock signal CKDP[2] to thereby provide the second clock signal CKDP[31].

The detection clock pattern generator 122a may output the detection clock output signal DC in response to the first clock signal CKD8 and the second clock signals CKDP[0:3]. The detection clock output signal DC may be output as a different data pattern for each data unit interval 8T. For example, the detection clock output signal DC may be output, in units of T corresponding to 1-bit data, as a random data pattern such as 10110111, 10110001, 10100101, or 11011100.

Figure 4A:
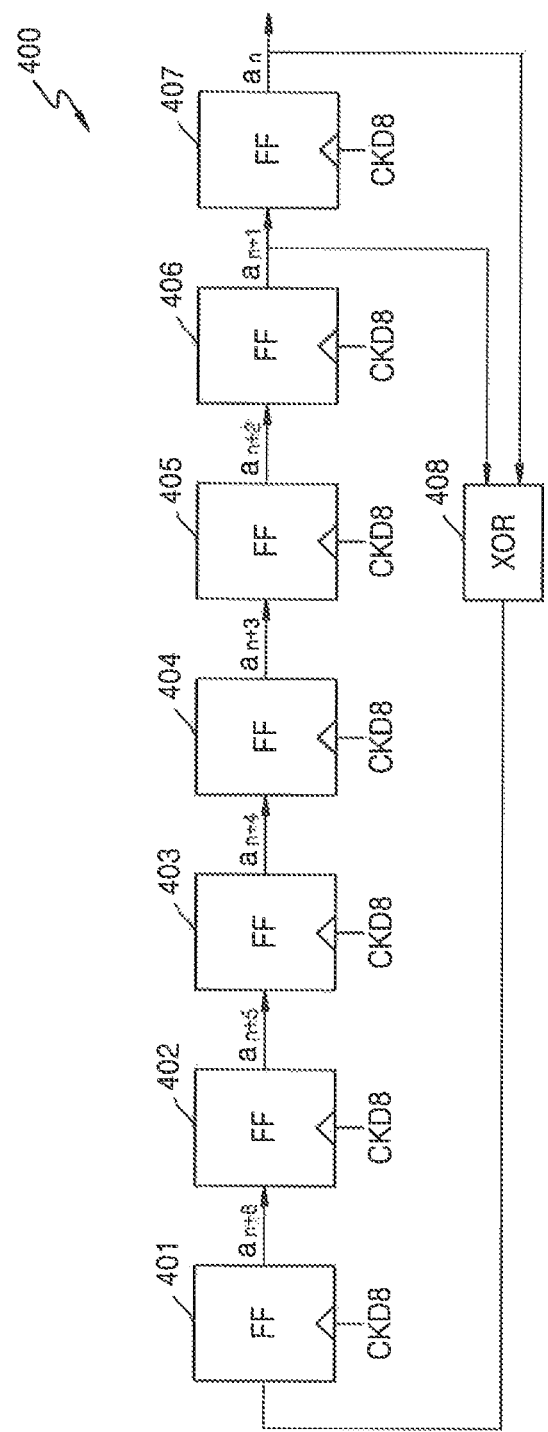
FIGS. 4A and 4B are diagrams illustrating a pseudo-random bit sequence (PRBS) generator of FIG. 3A.
Figure 4B:
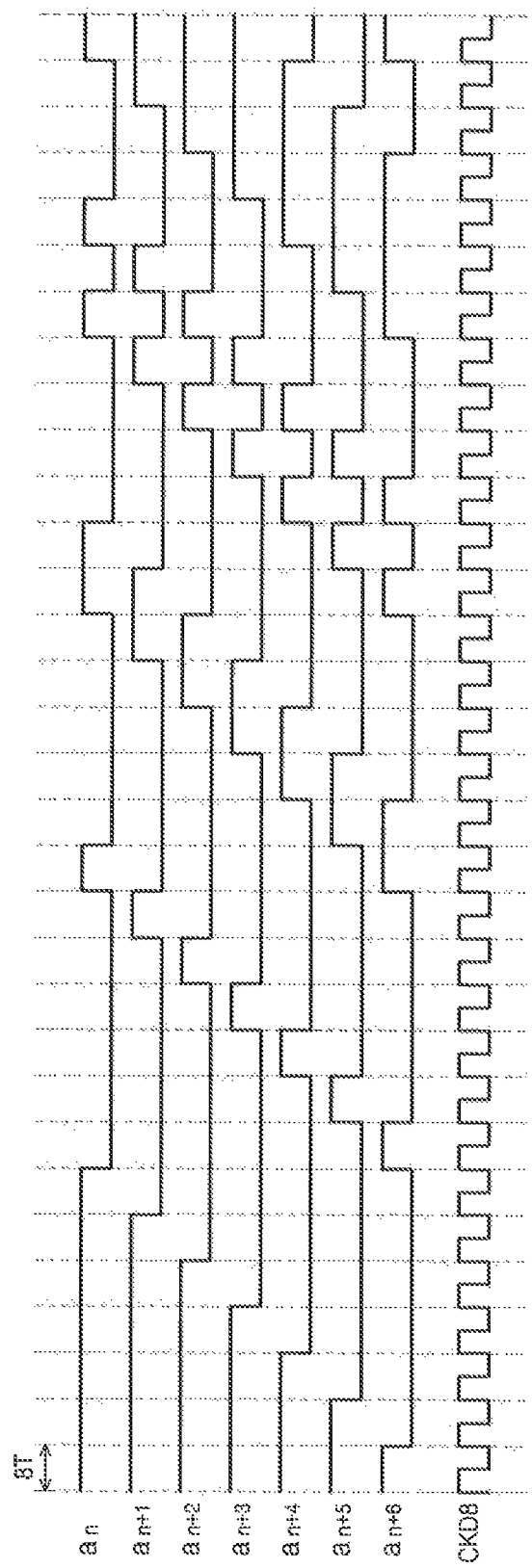

FIGS. 4A and 4B are diagrams illustrating the PRBS generator 400 of FIG. 3A. FIG. 4A is a circuit diagram of the PRBS generator 400, and FIG. 4B is a timing diagram illustrating an operation of the PRBS generator 400.

Referring to FIG. 4A, the PRBS generator 400 includes a plurality of flip-flops, for example, seven flip-flops 401 to 407, and an exclusive-OR gate 408. The plurality of flip-flops 401 to 407 may be serially connected and constitute a linear feedback shift register. The linear feedback shift register may generate $2^n-1$ random patterns. Here, n is the number of flip-flops constituting the linear feedback shift register. In the present embodiment, $2^7-1$, that is, 127 random patterns may be generated using the seven flip-flops 401 to 407.

The first flip-flop 401 receives the output of the exclusive-OR gate 408, and may latch the output of the exclusive-OR gate 408 in response to an edge (e.g., a rising edge) of the first clock signal CKD8 to output a random bit signal $a_{n+6}$. The second flip-flop 402 receives the output of the first flip-flop 401, and may latch the output of the first flip-flop 401 in response to an edge (e.g., a rising edge) of the first clock signal CKD8 to output a random bit signal $a_{n+5}$. In this manner, the third to seventh flip-flops 403 to 407 may latch the outputs of the preceding flip-flops in response to an edge (e.g., a rising edge) of the first clock signal CKD8, so as to output random bit signals $a_{n+4}$, $a_{n+3}$, $a_{n+2}$, $a_{n+1}$, and $a_n$, respectively.

The exclusive-OR gate 408 receives the random bit signal $a_{n+1}$, which is an output signal of the sixth flip-flop 406, and the random bit signal $a_n$, which is an output signal of the seventh flip-flop 407. The exclusive-OR gate 408 performs an exclusive-OR operation on the random bit signals $a_{n+1}$ and $a_n$ to provide an output to the first flip-flop 401.

Each of the random bit signals $a_n$ to $a_{n+6}$ generated by the PRBS generator 400 may be shifted by one clock cycle 8T of the first clock signal CKD8 in response to the first clock signal CKD8 having a period of a data unit interval 8T, as shown in FIG. 4B. The random bit signals $a_n$ to $a_{n+6}$ may be generated as 127 random patterns for each edge (e.g., rising edge) of the first clock signal CKD8. The random hit signals $a_n$ to $a_{n+6}$ including 127 random patterns may be repeatedly generated in response to the first clock signal CKD8.

Figure 5A:
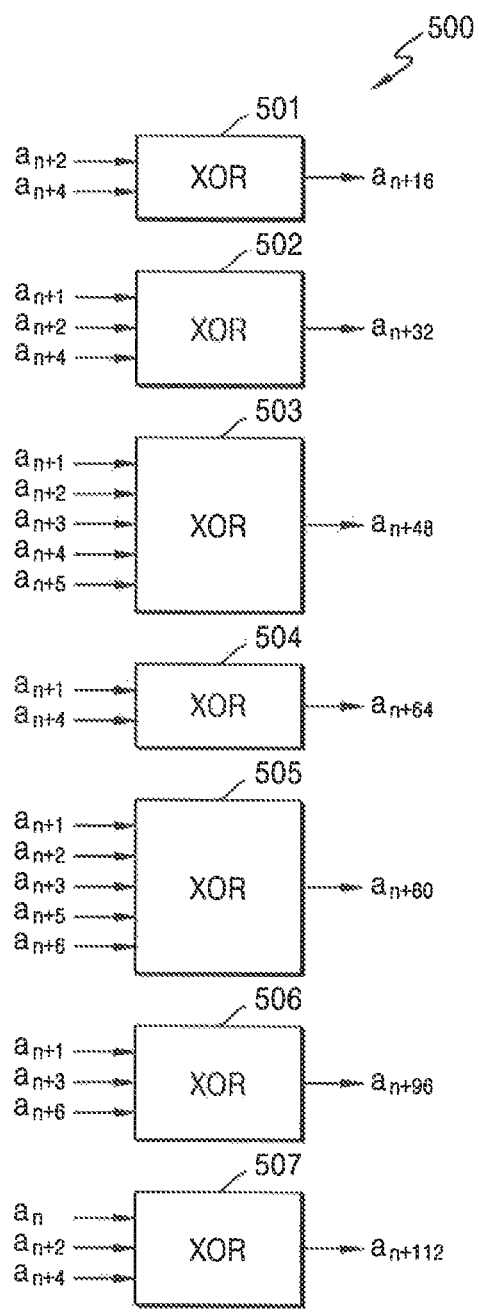
FIGS. 5A and 5B are diagrams illustrating a logic block of FIG. 3A.
Figure 5B:
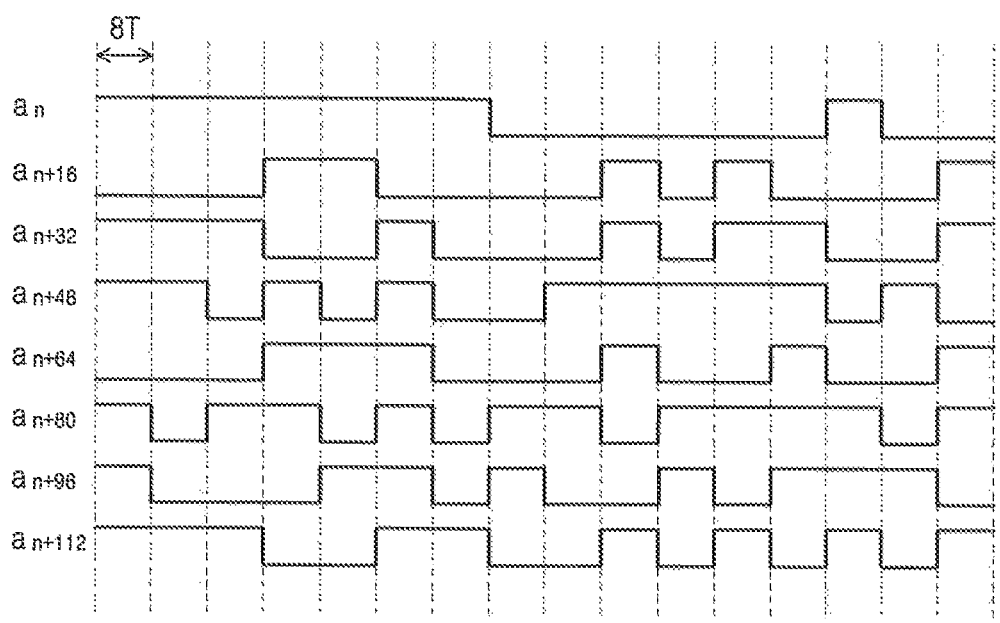

FIGS. 5A and 5B are diagrams illustrating the logic block 500 of FIG. 3A. FIG. 5A is a block diagram of the logic block 500, and FIG. 5B is a timing diagram illustrating an operation of the logic block 500.

Referring to FIG. 5A, the logic block 500 includes a plurality of exclusive-OR gates 501 to 507 that selectively receive the random bit signals $a_n$ to $a_{n+6}$ of the PRBS generator 400 of FIG. 4A. The exclusive-OR gates 501 to 507 may selectively receive the random bit signals $a_n$ to $a_{n+6}$ and may output logic output signals $a_{n+16}$, $a_{n+32}$, $a_{n+48}$, $a_{n+64}$, $a_{n+80}$, $a_{n+96}$, and $a_{n+112}$, respectively.

The first exclusive-OR gate 501 receives the random bit signals $a_{n+2}$ and $a_{n+4}$ and outputs the logic output signal $a_{n+16}$. The second exclusive-OR gate 502 receives the random bit signals $a_{n+1}$, $a_{n+2}$, and $a_{n+4}$ and outputs the logic output signal $a_{n+32}$. The third exclusive-OR gate 503 receives the random bit signals $a_{n+1}$, $a_{n+2}$, $a_{n+3}$, $a_{n+4}$, and $a_{n+5}$ and outputs the logic output signal $a_{n+48}$. The fourth exclusive-OR gate 504 receives the random bit signals $a_{1+1}$ and $a_{n+4}$ and outputs the logic output signal $a_{n+64}$. The fifth exclusive-OR gate 505 receives the random bit signals $a_{n+1}$, $a_{n+2}$, $a_{n+3}$, $a_{n+5}$, and $a_{n+6}$ and outputs the logic output sitmal $a_{n+80}$. The sixth exclusive-OR gate 506 receives the random hit signals $a_{n+1}$, $a_{n+3}$, and $a_{n+6}$ and outputs the logic output signal $a_{n+96}$. The seventh exclusive-OR gate 507 receives the random bit signals $a_n$, $a_{n+2}$, and $a_{n+4}$ and outputs the logic output signal $a_{n+112}$.

Each of the logic output signals $a_{n+16}$, $a_{n+32}$, $a_{n+48}$, $a_{n+64}$, $a_{n+80}$, $a_{n+96}$, and $a_{n+112}$ output from the logic block 500 includes a random data pattern, as shown in FIG. 5B. FIG. 5B shows the logic output signals $a_{n+16}$, $a_{n+32}$, $a_{n+48}$, $a_{n+64}$, $a_{n+80}$, $a_{n+96}$, and $a_{n+112}$ illustrated in the same time domain as the random bit signal a of FIG. 4B. The random bit signal $a_n$ and the logic output signals $a_{n+16}$, $a_{n+32}$, $a_{n+48}$, $a_{n+64}$, $a_{n+80}$, $a_{n+96}$, and $a_{n+112}$ are provided to the first pattern selector 600 of FIG. 6A.

Figure 6A:
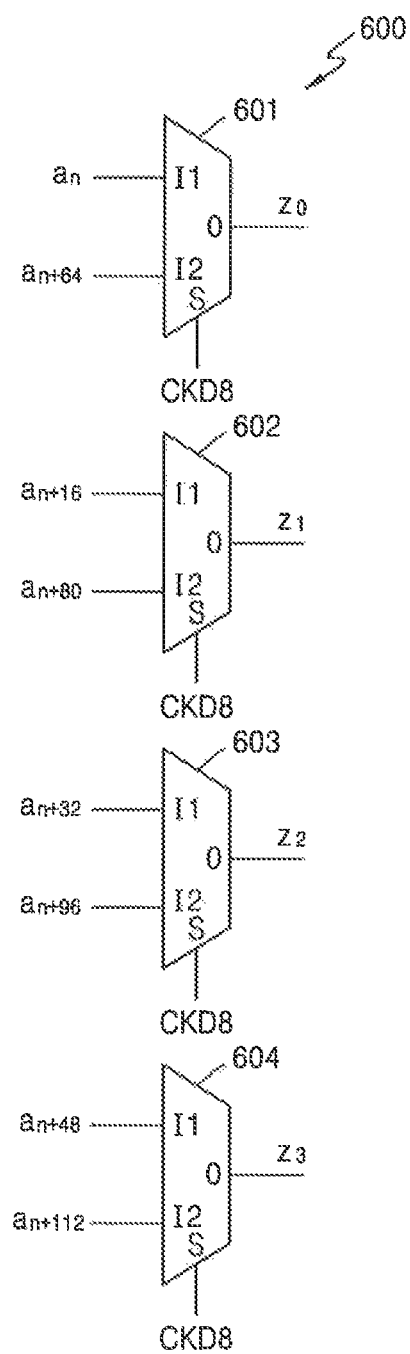
FIGS. 6A and 6B are diagrams illustrating a first pattern selector of FIG. 3A.
Figure 6B:
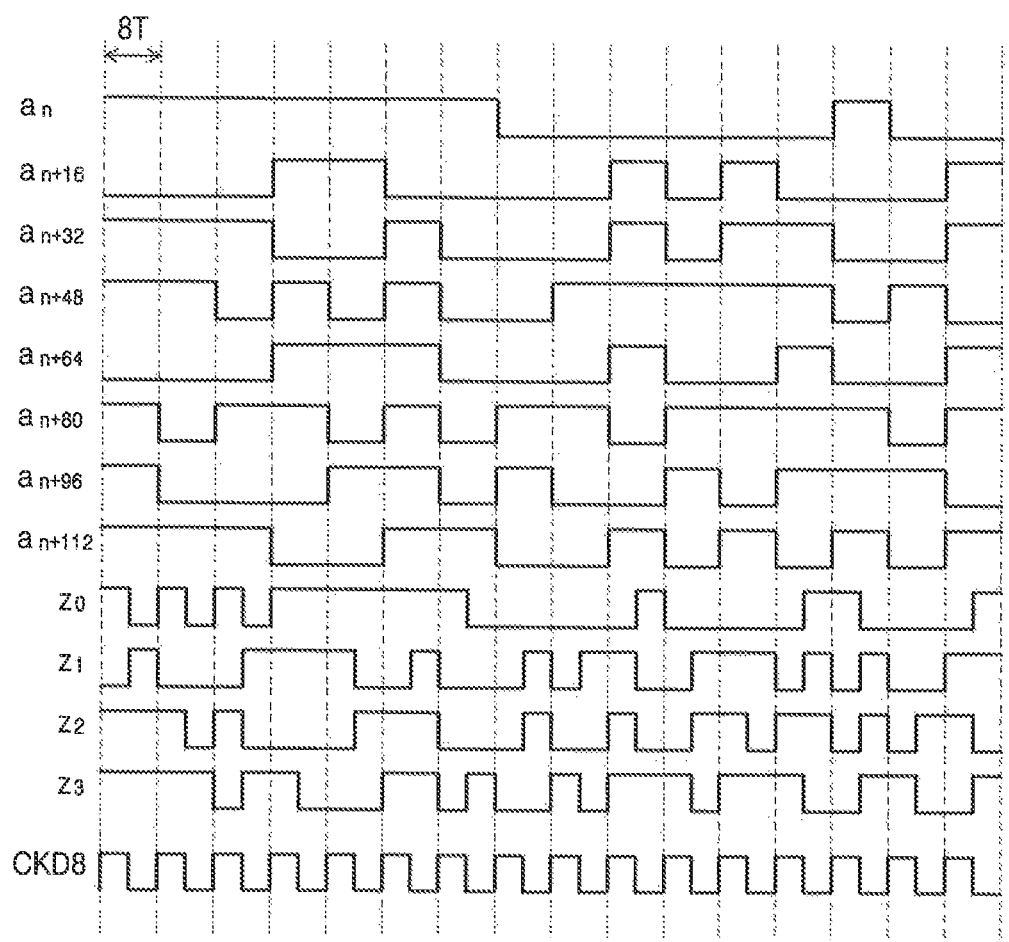

FIGS. 6A and 6B are diagrams illustrating the first pattern selector 600 of FIG. 3A. FIG. 6A is a circuit diagram of the first pattern selector 600, and FIG. 6B is a diagram illustrating an operation of the first pattern selector 600.

Referring to FIG. 6A, the first pattern selector 600 receives the random bit signal a output from the PRBS generator 400 and the logic output signals $a_{n+16}$, $a_{n+32}$, $a_{n+48}$, $a_{n+64}$, $a_{n+80}$, $a_{n+96}$, and $a_{n+112}$ output from the logic block 500. The first pattern selector 600 outputs signals, selected in response to the first clock signal CKD8 from among the signals $a_n$, $a_{n+16}$, $a_{n+32}$, $a_{n+48}$, $a_{n+64}$, $a_{n+80}$, $a_{n+96}$, and $a_{n+112}$, as first to fourth pattern signals $z_0$, $z_1$, $z_2$, and $z_3$. The first pattern selector 600 may be implemented with an 8:4 multiplexer including first to fourth multiplexers 601 to 604.

The first multiplexer 601 receives the random bit signal $a_n$ at a first input I1, receives the logic output signal $a_{n+64}$ at a second input I2, receives the first clock signal CKD8 at a selection input S, and outputs the first pattern signal $z_0$. The first pattern signal $z_0$ is generated depending on the state of the random bit signal $a_n$, the state of the logic output signal $a_{n+64}$, and the transition of the first clock signal CKD8. When the first clock signal CKD8 received at the selection input S is logic high, the state of the random bit signal $a_n$ received at the first input I1 is selected and output as the first pattern signal $z_0$. When the first clock signal CKD8 received at the selection input S is logic low, the state of the logic output signal $a_{n+64}$ received at the second input I2 is selected and output as the first pattern signal $z_0$.

The second multiplexer 602 receives the logic output signal $a_{n+16}$ at a first input I1, receives the logic output signal $a_{n+80}$ at a second input I2, receives the first clock signal CKD8 at a selection input S, and outputs the second pattern signal $z_1$. When the first clock signal CKD8 received at the selection input S is logic high, the state of the logic output signal $a_{n+16}$ received at the first input I1 is selected and output as the second pattern signal $z_1$. When the first clock signal CKD8 received at the selection input S is logic low, the state of the logic output signal $a_{n+80}$ received at the second input I2 is selected and output as the second pattern signal $z_1$.

The third multiplexer 603 receives the logic output signal $a_{n+32}$ at a first input I1, receives the logic output signal $a_{n+96}$ at a second input I2, receives the first clock signal CKD8 at a selection input S, and outputs the third pattern signal $z_2$. When the first clock signal CKD8 received at the selection input S is logic high, the state of the logic output signal $a_{n+32}$ received at the first input I1 is selected and output as the third pattern signal $z_2$. When the first clock signal CKD8 received at the selection input S is logic low, the state of the logic output signal $a_{n+96}$ received at the second input I2 is selected and output as the third pattern signal $z_2$.

The fourth multiplexer 604 receives the logic output signal $a_{n+48}$ at a first input I1, receive the logic output signal $a_n\pm_{112}$ at a second input I2, receives the first clock signal CKD8 at a selection input S, and outputs the fourth pattern signal $z_3$. When the first clock signal CKD8 received at the selection input S is logic high, the state of the logic output signal $a_{n+48}$ received at the first input I1 is selected and output as the fourth pattern signal $z_3$. When the first clock signal CKD8 received at the selection input S is logic low, the state of the logic output signal $a_{n+112}$ received at the second input I2 is selected and output as the fourth pattern signal $z_3$.

Each of the first to fourth pattern signals $z_0$, $z_1$, $z_2$, and $z_3$ output from the first pattern selector 600 includes a random data pattern, as shown in FIG. 6B. The first to fourth pattern signals $z_0$, $z_1$, $z_2$, and $z_3$ are provided to a second pattern selector 700 of FIG. 7A.

Figure 7A:
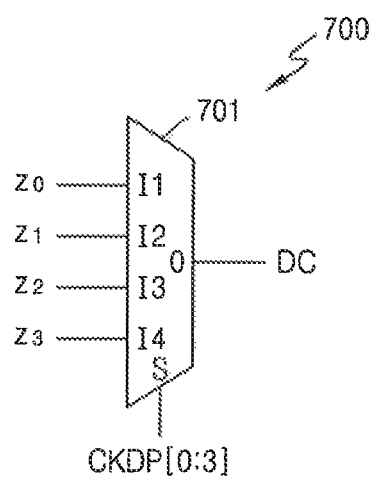
FIGS. 7A and 7B are diagrams illustrating a second pattern selector of FIG. 3A.
Figure 7B:
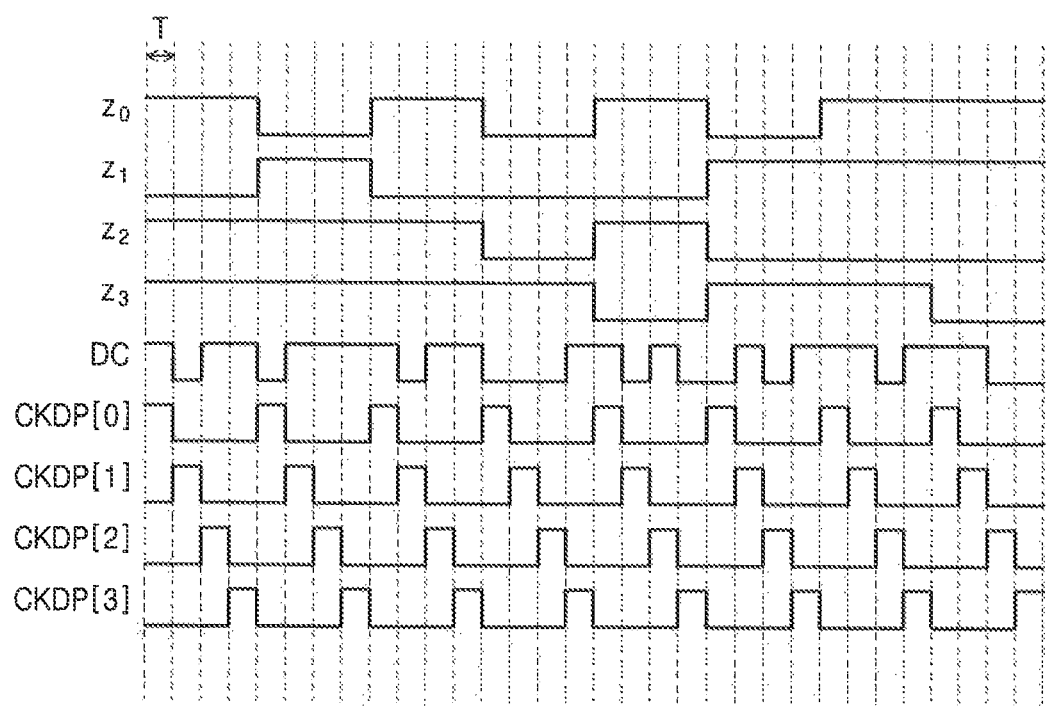

FIGS. 7A and 7B are diagrams illustrating the second pattern selector 700 of FIG. 3A. FIG. 7A is a circuit diagram of the second pattern selector 700, and FIG. 7B is a timing diagram illustrating an operation of the second pattern selector 700.

Referring to FIG. 7A, the second pattern selector 700 receives the pattern signals $z_0$, $z_1$, $z_2$, and $z_3$ output from the first pattern selector 600 and outputs a pattern signal, selected from among the pattern signals $z_0$, $z_1$, $z_2$, and $z_3$ in response to third clock signals CKDP[0:31], as a detection clock output signal DC. The second pattern selector 700 may be implemented with a 4:1 multiplexer.

The second pattern selector 700 receives the pattern signal $z_0$ at a first input I1, receives the pattern signal $z_1$ at a second input I2, receives the pattern signal $z_2$ at a third input I3, receives the pattern signal $z_3$ at a fourth input I4, receives the third clock signals CKDP[0:3] at a selection input S, and outputs the detection clock output signal DC. The detection clock output signal DC may be generated depending on the states of the pattern signals $z_0$, $z_1$, $z_2$, and $z_3$ and the states of the third clock signals CKDP[0:3]. When the third clock signal CKDP[0] at the selection input S is logic high, the state of the pattern signal $z_0$ at the first input I1 is selected and output as the detection clock output signal DC. When the third clock signal CKDP[1] at the selection input S is logic high, the state of the pattern signal $z_1$ at the second input I1 is selected and output as the detection clock output signal DC. When the third clock signal CKDP[2] at the selection input S is logic high, the state of the pattern signal $z_2$ at the third input I3 is selected and output as the detection clock output signal DC. When the third clock signal CKDP[3] at the selection input S is logic high, the state of the pattern signal $z_3$ at the fourth input I4 is selected and output as the detection clock output signal DC.

The detection clock output signal DC output from the second pattern selector 700 includes a random data pattern, as shown in FIG. 7B. The detection clock output signal DC may be provided as a random data pattern in 1-bit data units. The detection clock output signal DC is generated based on the random hit signals $a_n$ to $a_{n+6}$ of the PRBS generator 400 described with reference to FIG. 4A and includes a random data pattern. Since 127 random patterns are repeatedly generated in the random bit signals $a_n$ to $a_{n+6}$, the detection clock output signal DC may also be repeatedly generated according to the random bit signals $a_n$, to $a_{n+6}$ including 127 random patterns. Accordingly, the detection clock output signal DC may include a pseudo-random data pattern.

Figure 8A:
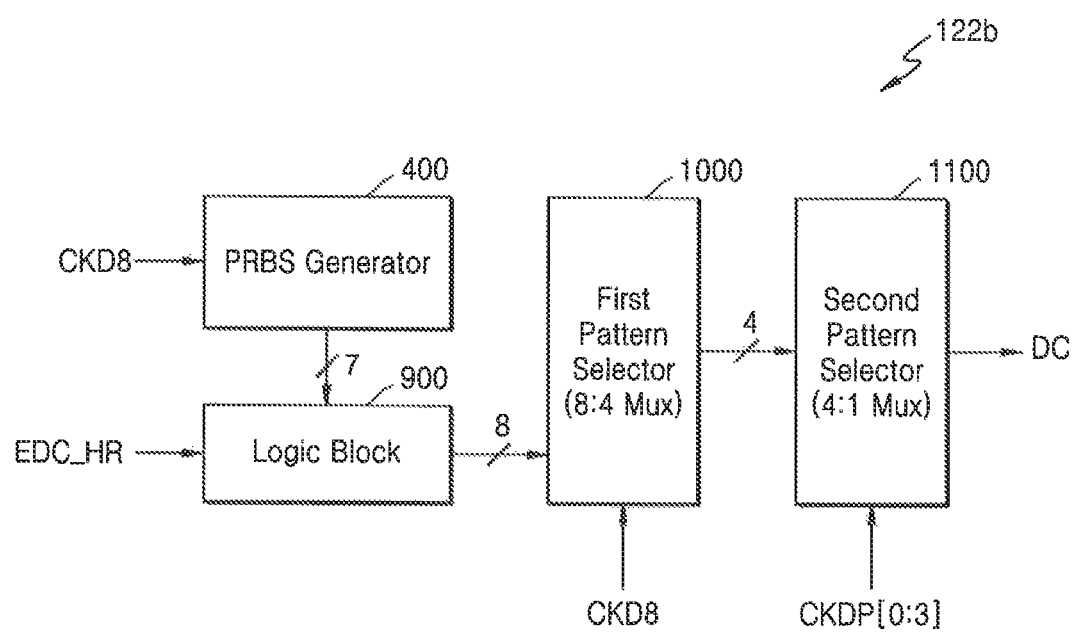
FIGS. 8A to 8C are diagrams illustrating a detection clock pattern generator according to an exemplary embodiment of an inventive concept.
Figure 8B:
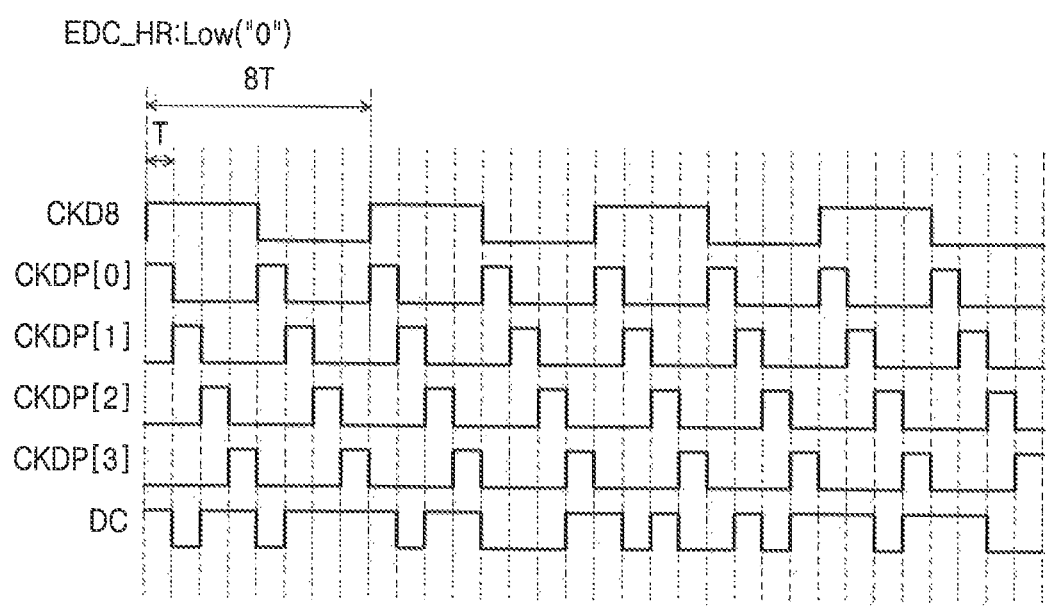
Figure 8C:
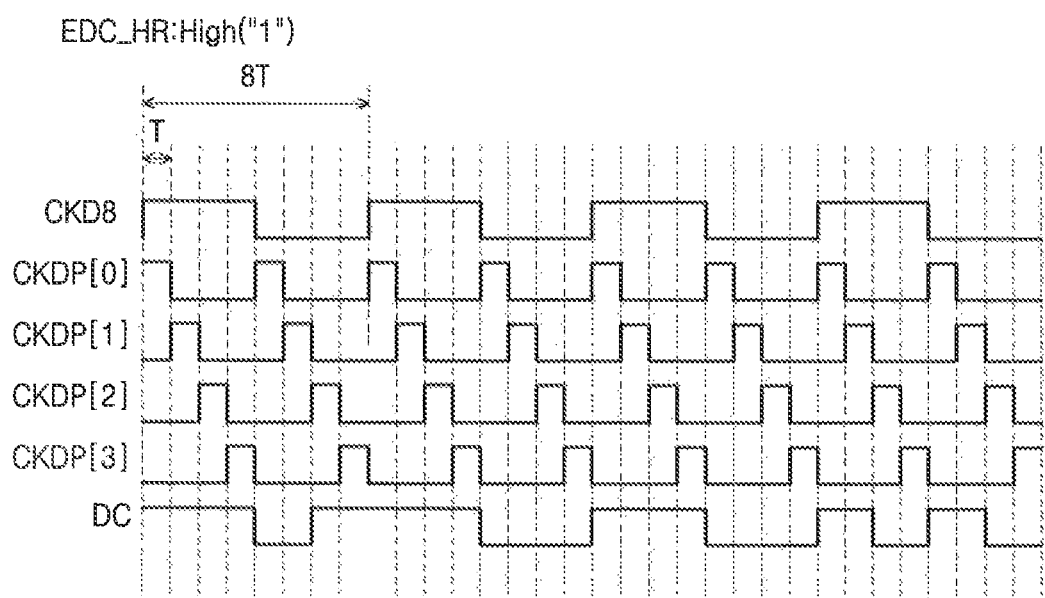

FIGS. 8A to 8C are diagrams illustrating a detection clock pattern generator according to an exemplary embodiment of an inventive concept. FIG. 8A is a block diagram of the detection clock pattern generator 122 of FIG. 1, FIG. 8B is a timing diagram illustrating an operation of the detection clock pattern generator 122 when the third control signal EDC_HR is logic low, and FIG. 8C is a timing diagram illustrating an operation of the detection clock pattern generator 122 when the third control signal EDC_HR is logic high. The third control signal EDC_HR is a signal for controlling a random data pattern of the detection clock output signal DC output from the detection clock pattern generator 122 to be output at a first rate or a second rate that is half the first rate. The first rate may be set such that the random data pattern is output in 1-bit data units, and the second rate may be set such that the random data pattern is output in 2-bit data units.

Referring to FIG. 8A, a detection clock pattern generator 122b, which corresponds to the detection clock pattern generator 122 of FIG. 1, generates a clock detection output signal including a random data pattern based on a state of the first control signal PRBS_EN provided from the mode register 121 of FIG. 1. The detection clock pattern generator 122b includes a PRBS generator 400, a logic block 900, a first pattern selector 1000, and a second pattern selector 1100.

The PRBS generator 400 of FIG. 8A is the same as the PRBS generator 400 shown in FIG. 4A. The PRBS generator 400 may be a linear feedback shift register including the seven flip-flops 401 to 407 and the exclusive-OR gate 408. The PRBS generator 400 may generate the plurality of random bit signals $a_n$ to $a_{n+6}$ in response to the first clock signal CKD8.

The logic block 900 receives the random bit signals $a_n$ to $a_{n+6}$ and generates a plurality of logic switching signals N1 to N8 in response to the third control signal EDC_HR. The logic block 900 may include a plurality of exclusive-OR gates and a plurality of switching devices. The plurality of logic switching signals N1 to N8 may be provided to the first pattern selector 1000.

The first pattern selector 1000 receives the logic switching signals N1 to N8 of the logic block 900 and generates a plurality of pattern signals $z_0$, $z_1$, $z_2$, and $z_3$ in response to the first clock signal CKD8. The first pattern selector 1000 may be implemented with a plurality of multiplexers. The pattern signals $z_0$, $z_1$, $z_2$, and $z_3$ are provided to the second pattern selector 1100.

The second pattern selector 1100 receives the pattern signals $z_0$, $z_1$, $z_2$, and $z_3$ and outputs a pattern signal, selected in response to second clock signals CKDP[0:3] from among the pattern signals $z_0$, $z_1$, $z_2$, and $z_3$, as a detection clock output signal DC. The second pattern selector 700 may be implemented with one multiplexer.

Referring to FIG. 1B, a first clock signal CKD8 having a period of a data unit interval 8T is provided. Each of the second clock signals CKDP[0:3] is provided as a pulse signal having a period of 4T that is half the data unit interval 8T and having a high level interval of T. When the third control signal EDC_HR is logic low, the detection clock pattern generator 122b outputs a detection clock output signal DC in response to the first signal CKD8 and the second clock signals CKDP[0:3]. The detection clock output signal DC may be output in units of T corresponding to 1-bit data, that is, may be output as a random data pattern at a first rate.

Referring to FIG. 8C, a first clock signal CKD8 having a period of a data unit interval 8T is provided, and each of second clock signals CKDP[0:3] is provided as a pulse signal having a period of 4T that is half the data unit interval 8T and having a high level interval of T. When the third control signal EDC_HR is logic high, the detection clock pattern generator 122b outputs a detection clock output signal DC, in response to the first signal CKD8 and the second clock signals CKDP[0:3]. The detection clock output signal DC may be output in units of 2T corresponding to 2-bit data, that is, may be output as a random data pattern at a second rate that is half the first rate.

Figure 9A:
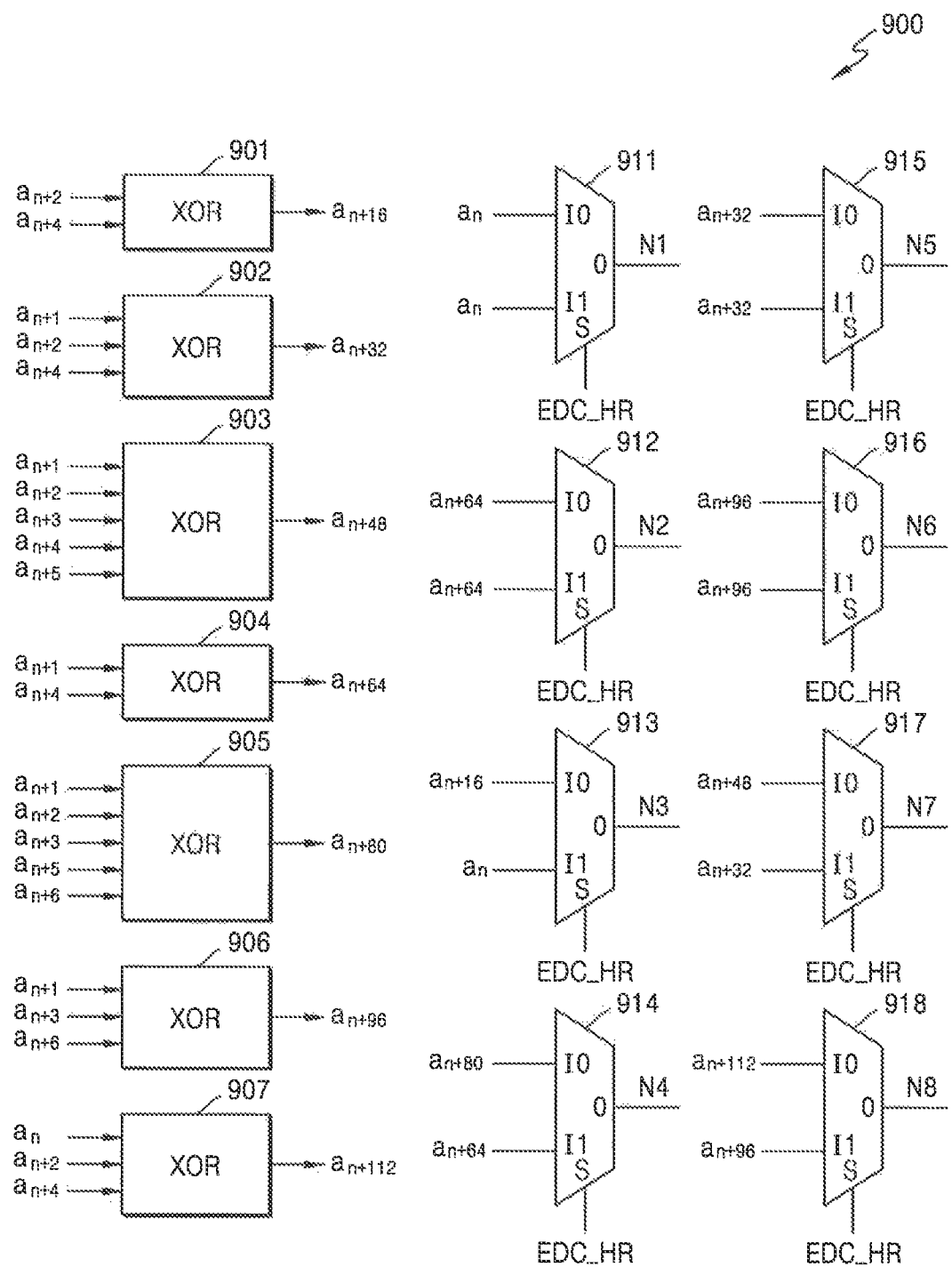
FIGS. 9A to 9C are diagrams illustrating a logic block of FIG. 8A.
Figure 9B:
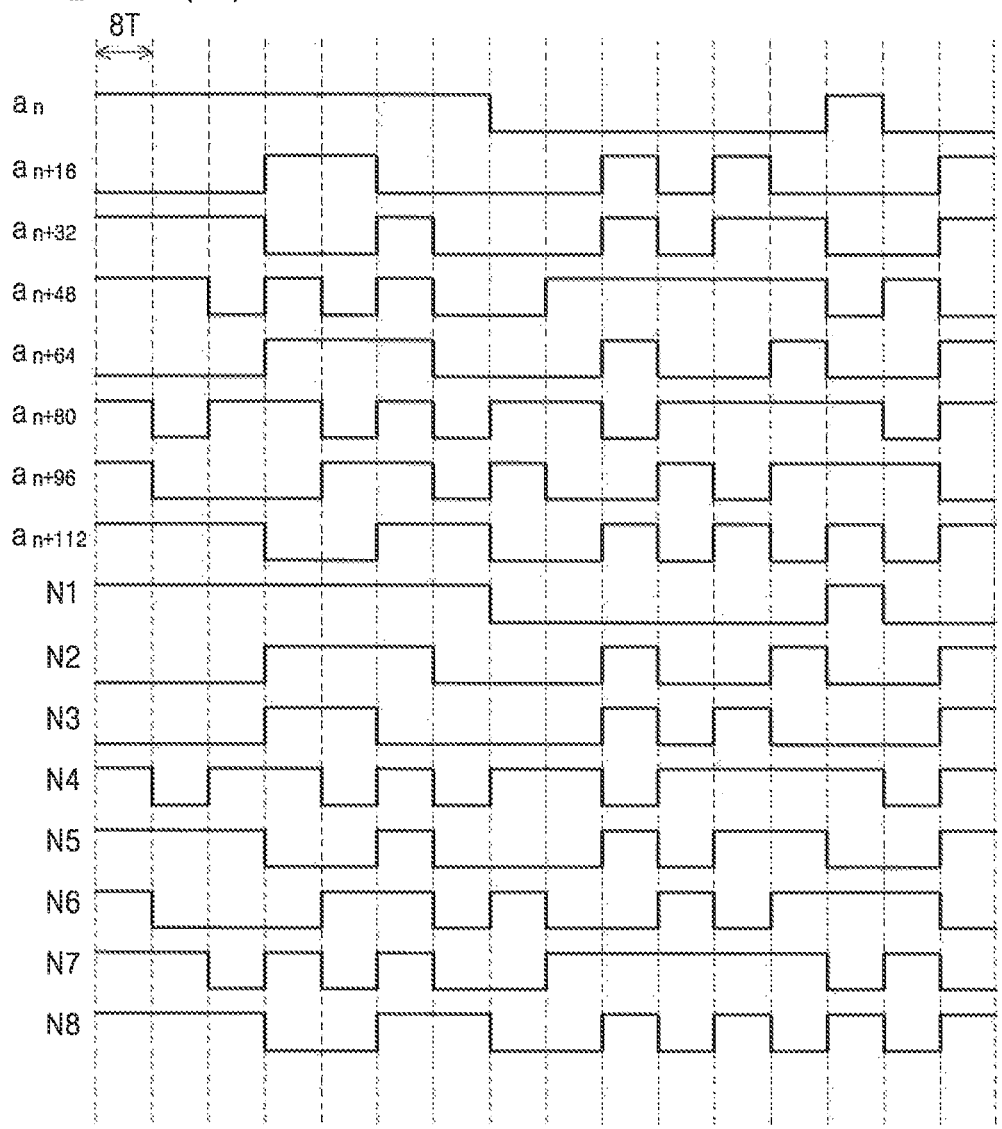
Figure 9C:
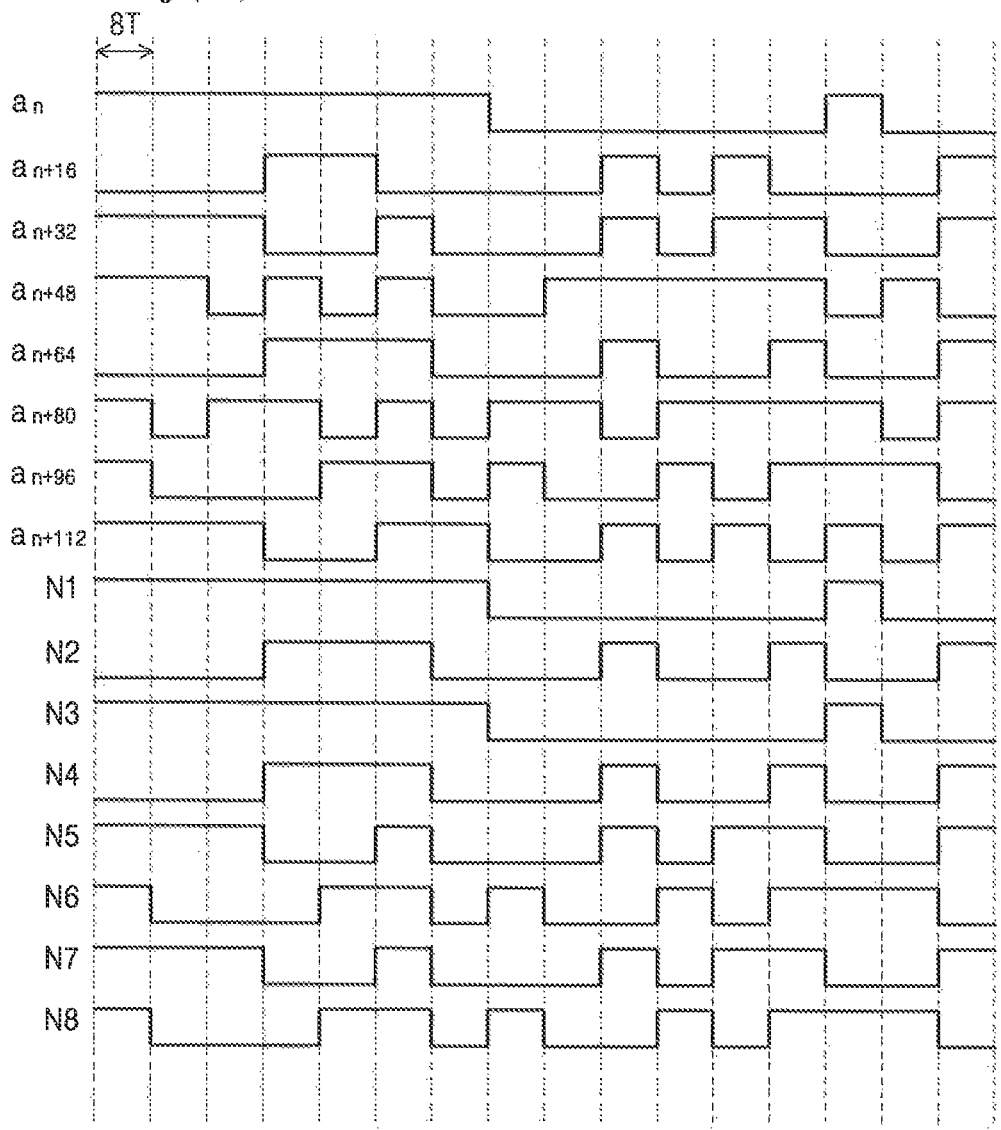

FIGS. 9A to 9C are diagrams illustrating the logic block 900 of FIG. 8A. FIG. 9A is a block diagram of the logic block 900, FIG. 9B is a timing diagram illustrating an operation of the logic block 900 when the third control signal EDC_HR is logic low, and FIG. 9C is a timing diagram illustrating an operation of the logic block 900 when the third control signal EDC_HR is a logic high.

Referring to FIG. 9A, the logic block 900 includes a plurality of exclusive-OR gates 901 to 907 and a plurality of switching devices 911 to 918. The plurality of exclusive-OR gates 901 to 907 may be configured in the same manner as the plurality of exclusive-OR gates 501 to 507 shown in FIG. 5A and may receive the random bit signals $a_n$ to $a_{n+6}$ of the PRGS generator 400. Each of the exclusive-OR gates 901 to 907 may selectively receive the random bit signals $a_n$ to $a_{n+6}$ and output logic output signals $a_{n+16}$, $a_{n+32}$, $a_{n+48}$, $a_{n+64}$, $a_{n+80}$, $a_{n+96}$, and $a_{n+112}$. The logic output signals $a_{n+16}$, $a_{n+32}$, $a_{n+48}$, $a_{n+64}$, $a_{n+80}$, $a_{n+96}$, and $a_{n+112}$ may be output as a random data pattern as in FIG. 5B.

The plurality of switching devices 911 to 918 receive the random bit signal $a_n$ and the logic output signals $a_{n+16}$, $a_{n+32}$, $a_{n+48}$, $a_{n+64}$, $a_{n+80}$, $a_{n+96}$, and $a_{n+112}$ and output signals, selected in response to the third control signal EDC_HR from among the random bit signal $a_n$ and the logic output signals $a_{n+16}$, $a_{n+32}$, $a_{n+48}$, $a_{n+64}$, $a_{n+80}$, $a_{n+96}$, and $a_{n+112}$, as first to eighth logic switching signals N1 to N8.

The first switching device 911 receives the random bit signal $a_n$ at a first input I0, receives the random bit signal $a_n$ at a second input I1, receives the third control signal EDC_HR at a selection input S, and outputs the first logic switching signal N1. When the third control signal EDC_HR of the selection input S is logic low, the state of the random bit signal $a_n$ of the first input I0 is selected and output as the first logic switching signal N1. When the third control signal EDC_HR of the selection input S is logic high, the state of the random bit signal $a_n$ of the second input I1 is selected and output as the first logic switching signal N1. The first switching device 911 outputs the random bit signal $a_n$ as the first logic switching signal N1 regardless of a logic level of the third control signal EDC_HR.

The second switching device 912 receives the logic output signal $a_{n+64}$ at a first input I0, receives the logic output signal $a_{n+64}$ at a second input I1, receives the third control signal EDC_HR at a selection input S, and outputs the second logic switching signal N2. When the third control signal EDC_HR of the selection input S is logic low, the state of the logic output signal $a_{n+64}$ of the first input I0 is selected and output as the second logic switching signal N2. When the third control signal EDC_HR of the selection input S is logic high, the state of the logic output signal $a_{n+64}$ of the second input I1 is selected and output as the second logic switching signal N2. The second switching device 912 outputs the logic output signal $a_{n+64}$ as the second logic switching signal N2 regardless of a logic level of the third control signal EDC_HR.

The third switching device 913 receives the logic output signal $a_{n+16}$ at a first input I0, receives the logic output signal $a_n$ at a second input I1, receives the third control signal EDC_HR at a selection input S, and outputs the third logic switching signal N3. When the third control signal EDC_HR of the selection input S is logic low, the state of the logic output signal $a_{n+16}$ of the first input I0 is selected and output as the third logic switching signal N3. When the third control signal EDC_HR of the selection input S is logic high, the state of the logic output signal $a_n$ of the second input I1 is selected and output as the third logic switching signal N3.

The fourth switching device 914 receives the logic output signal $a_{n+80}$ at a first input I0, receives the logic output signal $a_{n+64}$ at a second input I1, receives the third control signal EDC_HR at a selection input S, and outputs the fourth logic switching signal N4. When the third control signal EDC_HR of the selection input S is logic low, the state of the logic output signal $a_{n+80}$ of the first input I0 is selected and output as the fourth logic switching signal N4. When the third control signal EDC_HR of the selection input S is logic high, the state of the logic output signal $a_{n+64}$ of the second input I1 is selected and output as the fourth logic switching signal N4.

The fifth switching device 915 receives the logic output signal $a_{n+32}$ at a first input I0, receives the logic output signal $a_{n+32}$ at a second input I1, receives the third control signal EDC_HR at a selection input S, and outputs the fifth logic switching signal N5. When the third control signal EDC_HR of the selection input S is logic low, the state of the logic output signal $a_{n+32}$ of the first input I0 is selected and output as the fifth logic switching signal N5. When the third control signal EDC_HR of the selection input S is logic high, the state of the logic output signal $a_{n+32}$ of the second input I1 is selected and output as the fifth logic switching signal N5. The fifth switching device 915 outputs the logic output signal $a_{n+32}$ as the fifth logic switching signal N5 regardless of a logic level of the third control signal EDC_HR.

The sixth switching device 916 receives the logic output signal $a_{n+96}$ at a first input I0, receives the logic output signal $a_{n+96}$ at a second input I1 receives the third control signal EDC_HR at a selection input S, and outputs the sixth logic switching signal N6. When the third control signal EDC_HR of the selection input S is logic low, the state of the logic output signal $a_{n+96}$ of the first input I0 is selected and output as the sixth logic switching signal N6. When the third control signal EDC_HR of the selection input S is logic high, the state of the logic output signal $a_{n+96}$ of the second input I1 is selected and output as the sixth logic switching signal N6. The sixth switching device 916 outputs the logic output signal $a_{n+96}$ as the sixth logic switching signal N6 regardless of a logic level of the third control signal EDC_HR.

The seventh switching device 917 receives the logic output signal $a_{n+48}$ at a first input I0, receives the logic output signal $a_{n+32}$ at a second input I1, receives the third control signal EDC_HR at a selection input S, and outputs the seventh logic switching signal N7. When the third control signal EDC_HR of the selection input S is logic low, the state of the logic output signal $a_{n+48}$ of the first input I0 is selected and output as the seventh logic switching signal N7. When the third control signal EDC_HR of the selection input S is logic high, the state of the logic output signal $a_{n+32}$ of the second input I1 is selected and output as the seventh logic switching signal N7.

The eighth switching device 918 receives the logic output signal $a_{n+112}$ at a first input I0, receives the logic output signal $a_{b+96}$ at a second input I1, receives the third control signal EDC_HR at a selection input S, and outputs the eighth logic switching signal N8. When the third control signal EDC_HR of the selection input S is logic low, the state of the logic output signal $a_{n+112}$ of the first input I0 is selected and output as the eighth logic switching signal N8. When the third control signal EDC_HR of the selection input S is logic high, the state of the logic output signal $a_{n+96}$ of the second input I1 is selected and output as the eighth logic switching signal N8.

Referring to FIG. 9B, when the third control signal EDC_HR is logic low, the first to eighth logic switching signals N1 to N8 output from the logic block 900 include random data patterns. FIG. 9B shows the logic output signals $a_{n+16}$, $a_{n+32}$, $a_{n+48}$, $a_{n+64}$, $a_{n+80}$, $a_{n+96}$, and $a_{n+112}$ and the first to eighth logic switching signals N1 to N8 illustrated in the same time domain as the random bit signal $a_n$ of FIG. 4B. The first to eighth logic switching signals N1 to N8 may be generated with patterns of the logic output signals $a_n$, $a_{n+64}$, $a_{n+16}$, $a_{n+80}$, $a_{n+32}$, $a_{n+96}$, $a_{n+48}$, and $a_{n+112}$, respectively, received at the first inputs I0 of the first to eighth switching devices 911 to 918, and may be provided to the first pattern selector 1000 of FIG. 10A.

Referring to FIG. 9C, when the third control signal EDC_HR is logic high, the first to eighth logic switching signals N1 to N8 output from the logic block 900 include random data patterns. FIG. 9C shows the logic output signals $a_{n+16}$, $a_{n+32}$, $a_{n+48}$, $a_{n+64}$, $a_{n+80}$, $a_{n+96}$, and $a_{n+112}$ and the first to eighth logic switching signals N1 to N8 illustrated in the same time domain as the random bit signal $a_n$ of FIG. 4B. The first to eighth logic switching signals N1 to N8 may be generated with patterns of the logic output signals $a_n$, $a_{n+64}$, $a_n$, $a_{n+64}$, $a_{n+32}$, $a_{n+96}$, $a_{n+32}$, $a_{n+96}$, respectively, received at the second inputs I1 of the first to eighth switching devices 911 to 918, and may be provided to the first pattern selector 1000 of FIG. 10A.

Figure 10A:
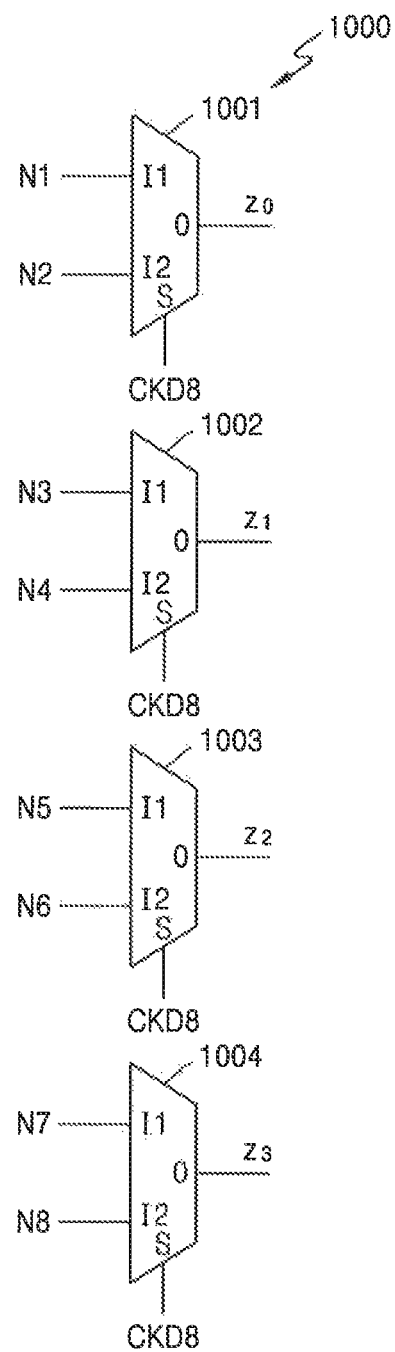
FIGS. 10A to 10C are diagrams illustrating a first pattern selector of FIG. 8A.
Figure 10B:
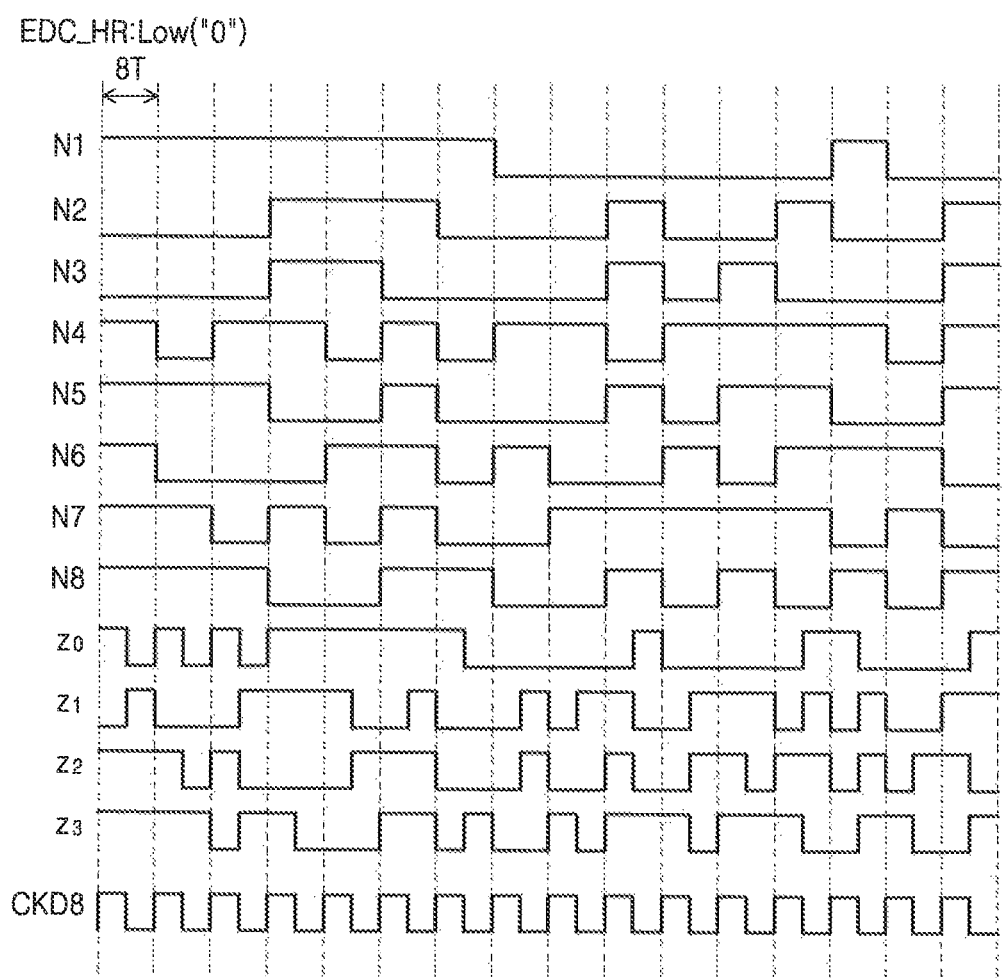
Figure 10C:
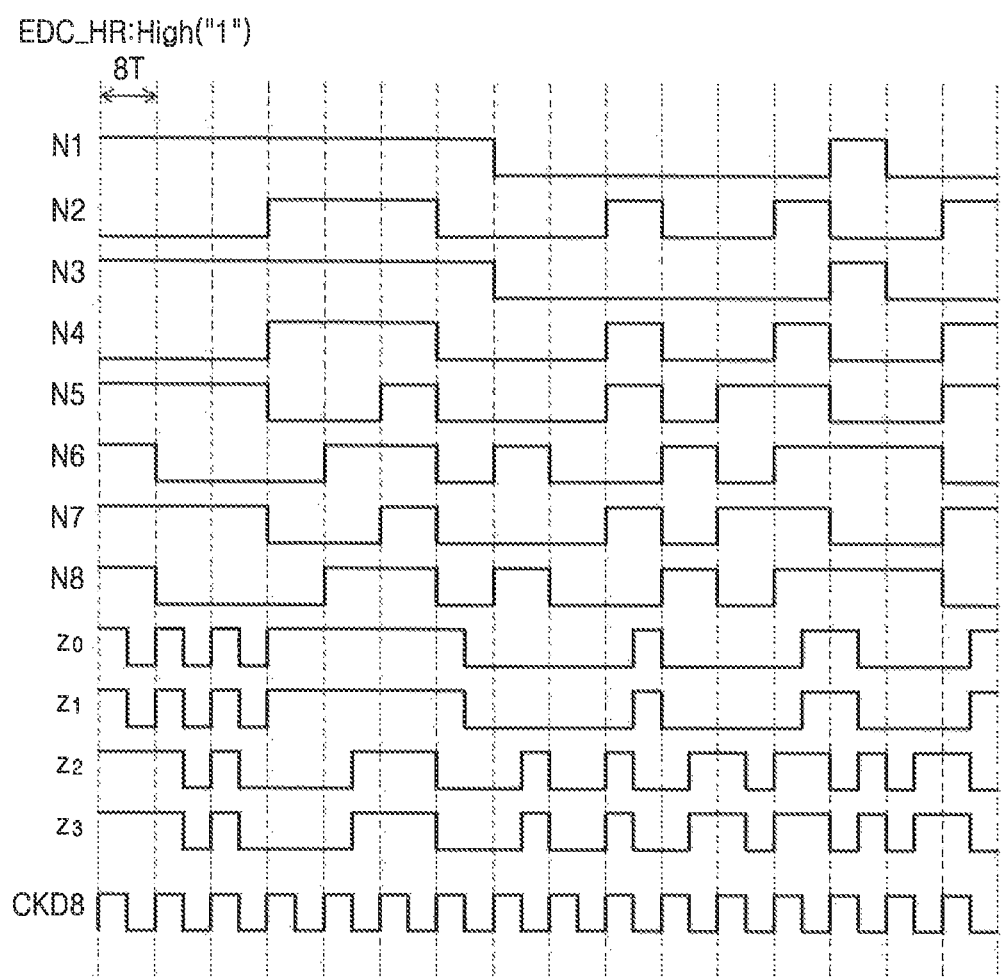

FIGS. 10A to 10C are diagrams illustrating the first pattern selector 1000 of FIG. 8A. FIG. 10A is a circuit diagram of the first pattern selector 1000, FIG. 10B is a timing diagram illustrating an operation of the first pattern selector 1000 when the third control signal EDC_HR is logic low, and FIG. 10C is a timing diagram illustrating an operation of the first pattern selector 1000 when the third control signal EDC_HR is logic high.

Referring to FIG. 10A, the first pattern selector 1000 receives the first to eighth logic switching signals N1 to N8 output from the logic block 900. The first pattern selector 1000 outputs signals, selected in response to the first clock signal CKD8 from among the first to eighth logic switching signals N1 to N8, as the first to fourth pattern signals $z_0$, $z_1$, $z_2$, and $z_3$. The first pattern selector 1000 may be implemented with an 8:4 multiplexer including first to fourth multiplexers 1001 to 1004.

The first multiplexer 1001 receives the first logic switching signal N1 at a first input I1, receives the second logic switching signal N2 at a second input I2, receives the first clock signal CKD8 at a selection input S, and outputs the first pattern signal $z_0$. When the first clock signal CKD8 of the selection input S is logic high, the state of the first logic switching signal N1 of the first input I1 is selected and output as the first pattern signal $z_0$. When the first clock signal CKD8 of the selection input S is logic low, the state of the second logic switching signal N2 of the second input I2 is selected and output as the first pattern signal $z_0$.

The second multiplexer 1002 receives the third logic switching signal N3 at a first input I1, receives the fourth logic switching signal N4 at a second input I2, receives the first clock signal CKD8 at a selection input S, and outputs the second pattern signal $z_1$. When the first clock signal CKD8 of the selection input S is logic high, the state of the third logic switching signal N3 of the first input I1 is selected and output as the second pattern signal $z_1$. When the first clock signal CKD8 of the selection input S is logic low, the state of the fourth logic switching signal N4 of the second input I2 is selected and output as the second pattern signal $z_1$.

The third multiplexer 1003 receives the fifth logic switching signal N5 at a first input I1, receives the sixth logic switching signal N6 at a second input I2, receives the first clock signal CKD8 at a selection input S, and outputs the third pattern signal $z_2$. When the first clock signal CKD8 of the selection input S is logic high, the state of the fifth logic switching signal N5 of the first input I1 is selected and output as the third pattern signal $z_2$. When the first clock signal CKD8 of the selection input S is logic low, the state of the sixth logic switching signal N6 of the second input I2 is selected and output as the third pattern signal $z_2$.

The fourth multiplexer 1004 receives the seventh logic switching signal N7 at a first input I1, receives the eighth logic switching signal N8 at a second input I2, receives the first clock signal CKD8 at a selection input S, and outputs the fourth pattern signal $z_3$. When the first clock signal CKD8 of the selection input S is logic high, the state of the seventh logic switching signal N7 of the first input I1 is selected and output as the fourth pattern signal $z_3$. When the first clock signal CKD8 of the selection input S is logic low, the state of the eighth logic switching signal N8 of the second input I2 is selected and output as the fourth pattern signal $z_3$.

Referring to FIG. 10B, when the third control signal EDC_HR is logic low, each of the first to fourth pattern signals $z_0$, $z_1$, $z_2$, and $z_3$ output from the first pattern selector 1000 includes a random data pattern. FIG. 10B shows the first to fourth pattern signals $z_0$, $z_1$, $z_2$, and $z_3$ illustrated in the same time domain as the first to eighth logic switching signals N1 to N8 of FIG. 9B.

Referring to FIG. 10C, when the third control signal EDC_HR is logic high, each of the first to fourth pattern signals $z_0$, $z_1$, $z_2$, and $z_3$ output from the first pattern selector 1000 includes a random data pattern. FIG. 10C shows the first to fourth pattern signals $z_0$, $z_1$, $z_2$, and $z_3$ illustrated in the same time domain as the first to eighth logic switching signals N1 to N8 of FIG. 9C. The first to fourth pattern signals $z_0$, $z_1$, $z_2$, and $z_3$ of FIG. 10B or 10C may be provided to a second pattern selector 1100 of FIG. 11A.

Figure 11A:
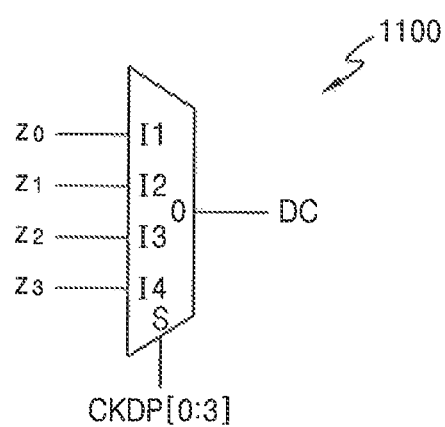
FIGS. 11A to 11C are diagrams illustrating a second pattern selector of FIG. 8A.
Figure 11B:
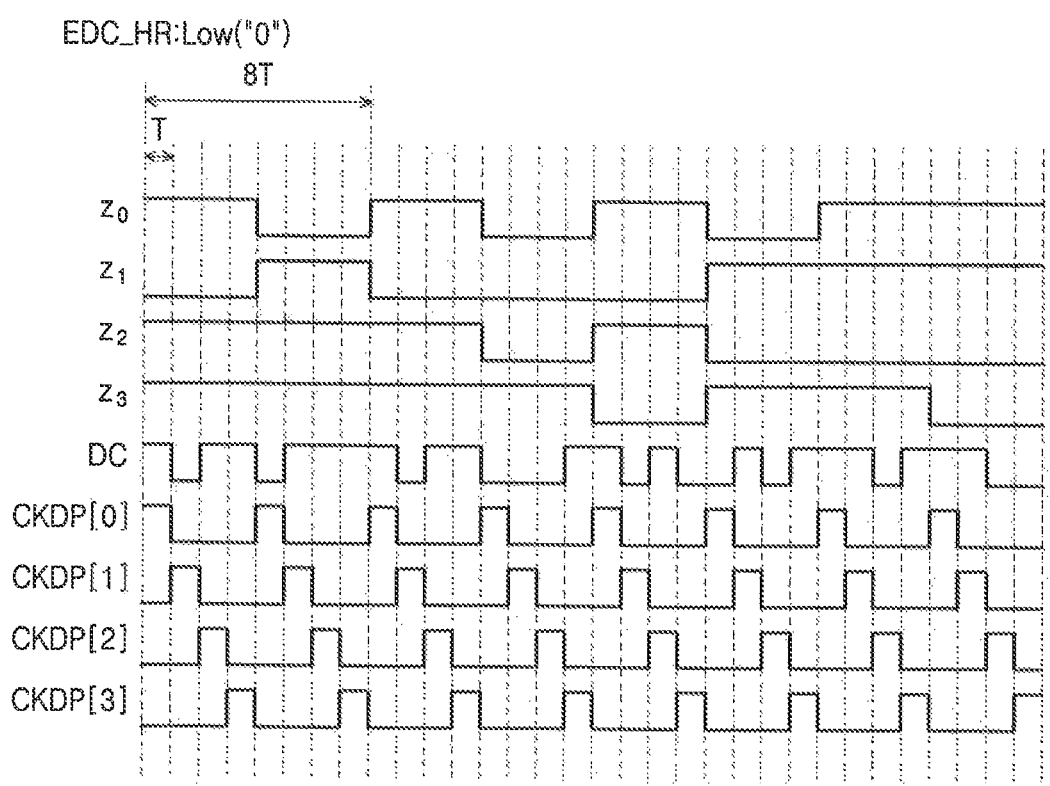
Figure 11C:
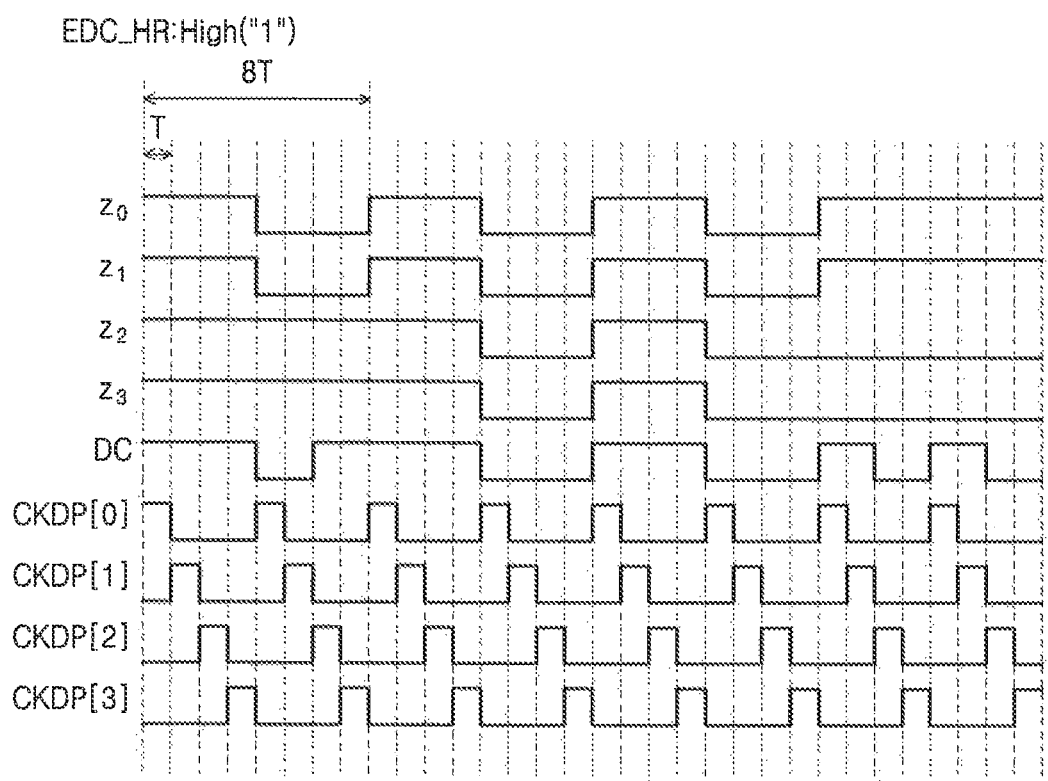

FIGS. 11A to 11C are diagrams illustrating the second pattern selector 1100 of FIG. 8A. FIG. 11A is a circuit diagram of the second pattern selector 1100. FIG. 11B is a timing diagram illustrating an operation of the second pattern selector 1100 when the third control signal EDC_HR is logic low, and FIG. 11C is a timing diagram illustrating an operation of the second pattern selector 1100 when the third control signal EDC_HR is logic high.

Referring to FIG. 11A, the second pattern selector 1100 receives the first to fourth pattern signals $z_0$, $z_1$, $z_2$, and $z_3$ output from the first pattern selector 1000 and outputs a pattern signal, selected from among the first to fourth pattern signals $z_0$, $z_1$, $z_2$, and $z_3$ in response to the third clock signals CKDP[0:3], as a detection clock output signal DC. The second pattern selector 1100 may be implemented with a 4:1 multiplexer.

The second pattern selector 1100 receives the first pattern signal $z_0$ at a first input I1, receives the second pattern signal $z_1$ at a second input I2, receives the third pattern signal $z_2$ at a third input I3, receives the fourth pattern signal $z_3$ at a fourth input I4, receives the third clock signals CKDP[0:3] at a selection input S, and outputs the detection clock output signal DC. In the second pattern selector 1100, when the third clock signal CKDP[0] at the selection input S is logic high, the state of the first pattern signal $z_0$ at the first input I1 is selected and output as the detection clock output signal DC. When the third clock signal CKDP[1] at the selection input S is logic high, the state of the second pattern signal $z_1$ at the second input I1 is selected and output as the detection clock output signal DC. When the third clock signal CKDP[2] at the selection input S is logic high, the state of the third pattern signal $z_2$ at the third input I3 is selected and output as the detection clock output signal DC. When the third clock signal CKDP[3] at the selection input S is logic high, the state of the fourth pattern signal $z_3$ at the fourth input I4 is selected and output as the detection clock output signal DC.

Referring to FIG. 11B, when the third control signal EDC_HR is logic low, the detection clock output signal DC output from the second pattern selector 1100 includes a random data pattern. FIG. 11B shows a detection clock output signal DC illustrated in the same time domain as the first to fourth pattern signals $z_0$, $z_1$, $z_2$, and $z_3$ of FIG. 10B. In FIG. 11B, it may be seen that the random data pattern of the detection clock output signal DC is output at a first rate at which the random data pattern transits in 1-bit data units.

Referring to FIG. 11C, when the third control signal EDC_HR is logic high, the detection clock output signal DC output from the second pattern selector 1100 includes a random data pattern. FIG. 11C shows a detection clock output signal DC illustrated in the same time domain as the first to fourth pattern signals $z_0$, $z_1$, $z_2$, and $z_3$ of FIG. 10C. In FIG. 11C, it may be seen that the random data pattern of the detection clock output signal DC is output at a second rate at which the random data pattern transits in 2-bit data units. The second rate is half the first rate.

In the present embodiment, the random data pattern of the detection clock output signal DC generated according to the third control signal EDC_HR in the detection clock pattern generator 122b of FIG. 8A may be output at the first rate at which the random data pattern transits in 1-bit data units, as shown in FIG. 11B, or may be output at the second rate at which the random data pattern transits in 2-bit data units, as shown in FIG. 11C. However, the scope of the inventive concept is not limited thereto, as the second rate may be $1/2^n$ times the first rate, where n is a natural number.

Figure 12:
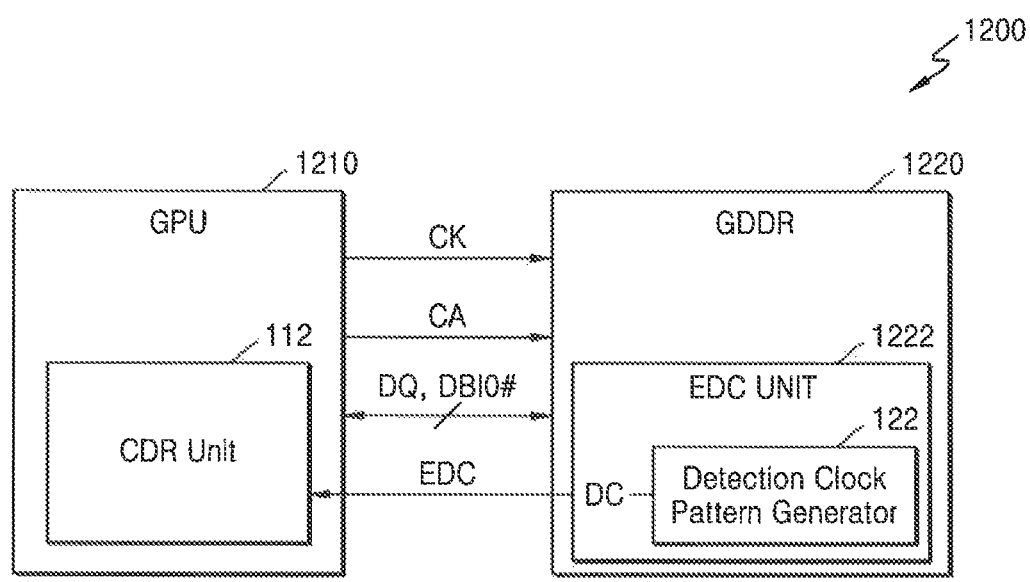
FIGS. 12 and 13 are diagrams illustrating a graphics memory system including a memory device, according to an exemplary embodiment of the inventive concept.
Figure 13:
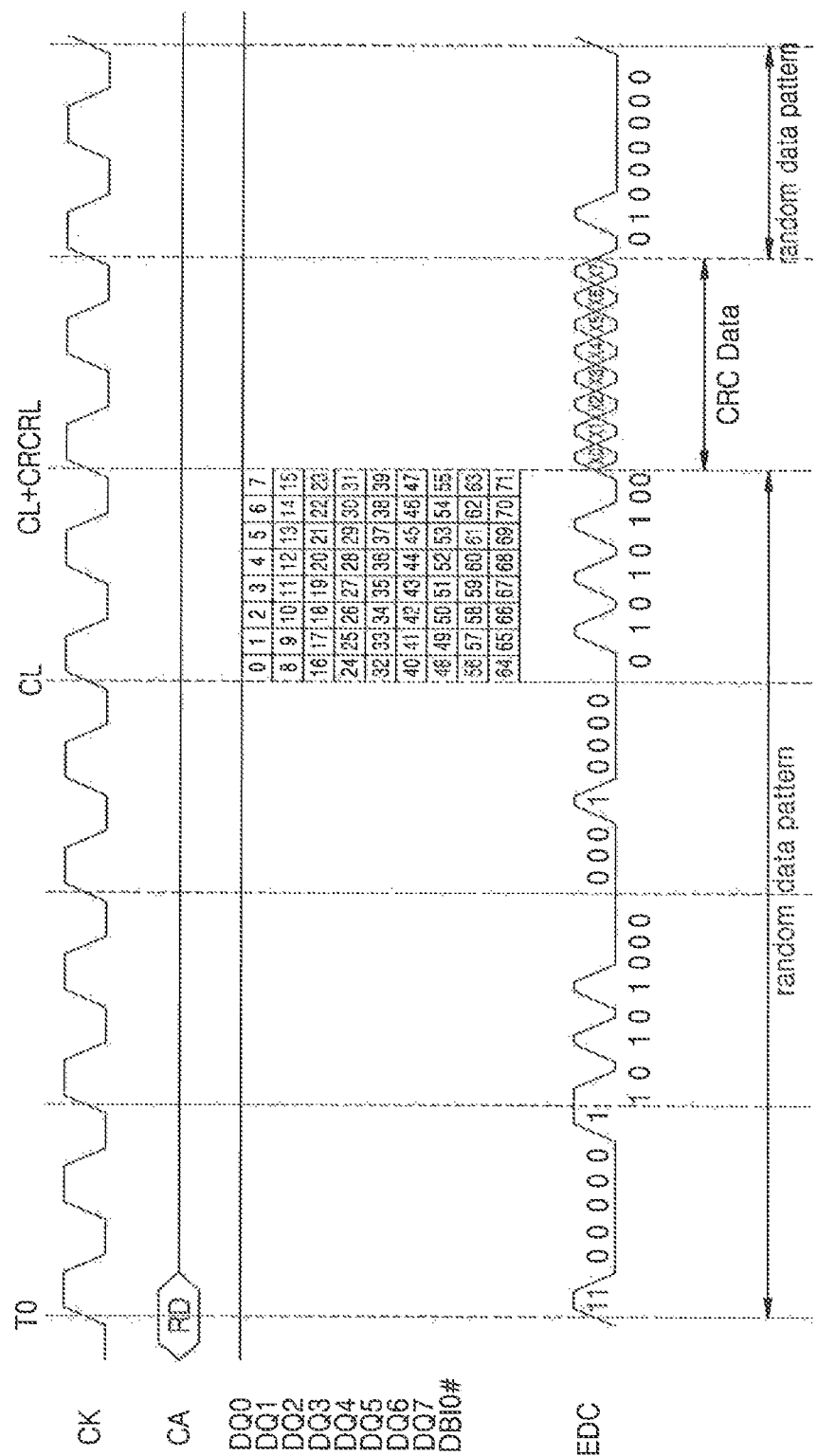

FIGS. 12 and 13 are diagrams illustrating a graphics memory system 1200 including a memory device according to an exemplary embodiment of the inventive concept.

Referring to FIG. 12, the graphics memory system 1200 includes a GPU 1210 and a GDDR 1220 (e.g., a DRAM). The GPU 1210 includes a CDR unit 112 (e.g., a CDR circuit), and the GDDR 1220 includes a detection clock pattern generator 122. The detection clock pattern generator 122 may be any one of the detection clock pattern generators 122a and 122b described with reference to FIGS. 3A to 11C. The detection clock pattern generator 122 generates a detection clock output signal DC including a random data pattern. The CDR unit 112 may perform a clock data recovery operation by using the detection clock output signal DC transmitted from the GDDR 1220. The clock data recovery operation may adjust and lock a phase so that the edge of a clock signal is in the middle of the received detection clock output signal DC.

The GDDR 1220 may provide detection of an error in data DQ in a data access mode by the GPU 1210 to improve data reliability of the graphics memory system 1200. The GDDR 1220 includes an error detection code (EDC) unit 1222 (e.g., an error detection code circuit) that generates a checksum or a cyclic redundancy check (CRC) with respect to read or write data DQ and transmits the generated checksum or CRC to the GPU 1210. Based on the checksum, the GPU 1210 may determine whether there is an error in the CRC and reissue a read or write command.

For example, it is assumed that the data access mode of the GDDR 1220 is a read mode, as shown in FIG. 13. 8-bit data corresponding to a burst length of 8 (BL8) may be output from DQ0 to DQ7 pins at the time when a CAS latency CL set in the GDDR 1220 elapses after the application of a read command RD at time T0. In addition, a data bus inversion signal indicating a data inversion signal of a corresponding burst length may be output to a DBI0# pin. The EDC unit 1222 may calculate 8-bit CRC data X0 to X7 with respect to 9 channels including the DQ to DQ7 pins and the DBI0# pin and 72-bit data of 9 channels (i.e., 8-bit data for each channel). The EDC unit 1222 may provide the 8-bit CRC data X0 to X7 to the GPU 1210 via an error detection code (EDC) pin EDC after a read latency CRCRL.

The EDC unit 1222 includes a detection clock pattern generator 122. The EDC unit 1222 may output a detection clock output signal DC generated by the detection clock pattern generator 122 to the EDC pin EDC in an operation mode (e.g., a clocking mode) other than the data access mode of the GDDR 1220. The detection clock output signal DC may be output as random data patterns via the EDC pin EDC. According to an embodiment, the detection clock pattern generator 122 is not included in the EDC unit 1222 but is instead present as a separate circuit block.

FIGS. 14 and 15A to 15C are diagrams illustrating a graphics memory system 1400 including a memory device according to an exemplary embodiment of the inventive concept.

Figure 14:
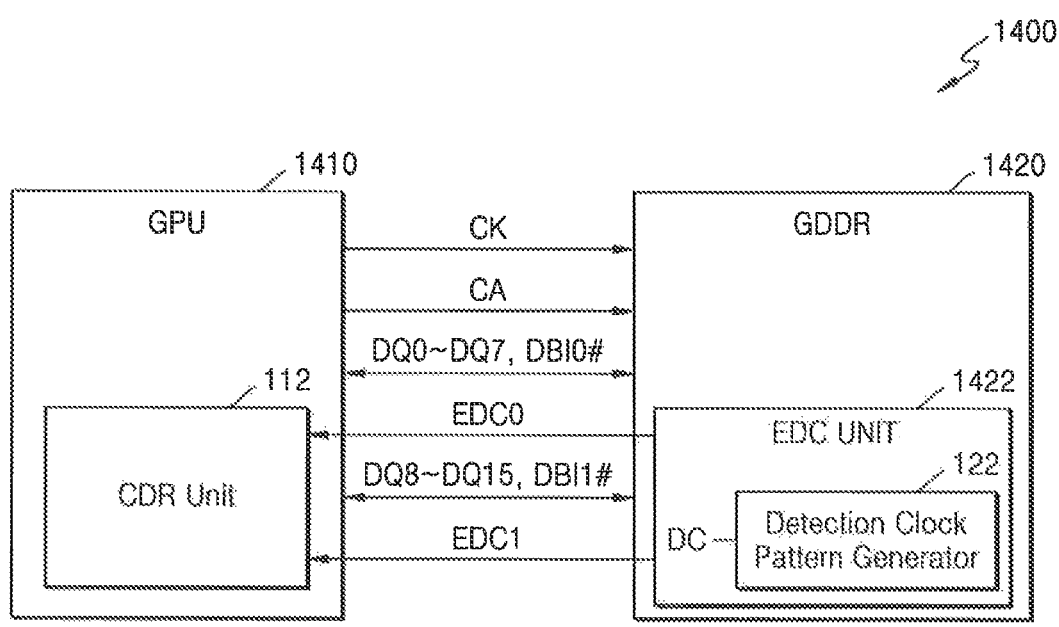

The graphics memory system 1400 of FIG. 14 differs from the graphics memory system 1200 of FIG. 12 in that an EDC unit 1422 (e.g., an EDC circuit) is connected to a first EDC pin EDC0 and a second EDC pin EDC1, but the rest of the components in the graphics memory system 1400 of FIG. 14 are almost identical to those of the graphics memory system 1200 of FIG. 12. The graphics memory system 1400 includes a GPU 1410 and a GDDR 1420 (e.g., a DRAM). Hereinafter, differences between the graphics memory system 1400 of FIG. 14 and the graphics memory system 1200 of FIG. 12 will be mainly described.

Figure 15A:
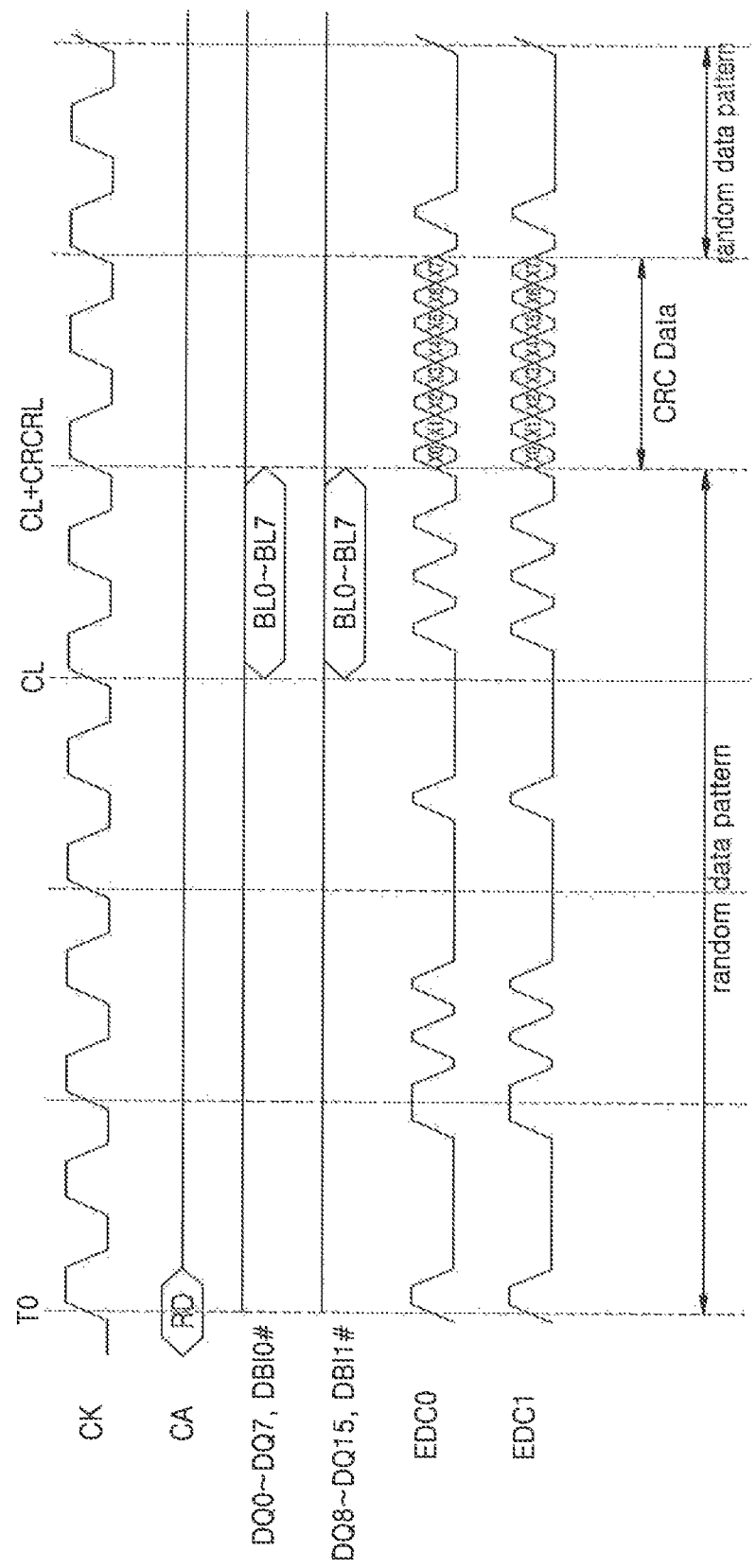

Referring to FIGS. 14 and 15A, the EDC unit 1422 calculates CRC data X0 to X7 for data BL0 to BL7 of a first EDC group including DQ0 to DQ7 pins and a DBI0# pin and provides the calculated CRC data X0 to X7 to a GPU 1410 via the first EDC pin EDC0. The EDC unit 1422 calculates CRC data X0 to X7 for data BL0 to BL7 of a second EDC group including DQ8 to DQ15 pins and a DBI1# pin and provides the calculated CRC data X0 to X7 to the GPU 1410 via the second EDC pin EDC1.

The EDC unit 1422 includes a detection clock pattern generator 122. The EDC unit 1422 may output a detection clock output signal DC including random data patterns generated by the detection clock pattern generator 122 to the first and second EDC pins EDC0 and EDC1 in a clocking mode. The detection clock output signal DC output to the first EDC pin EDC0 may be the same as that output to the second EDC pin EDC1.

Figure 15B:
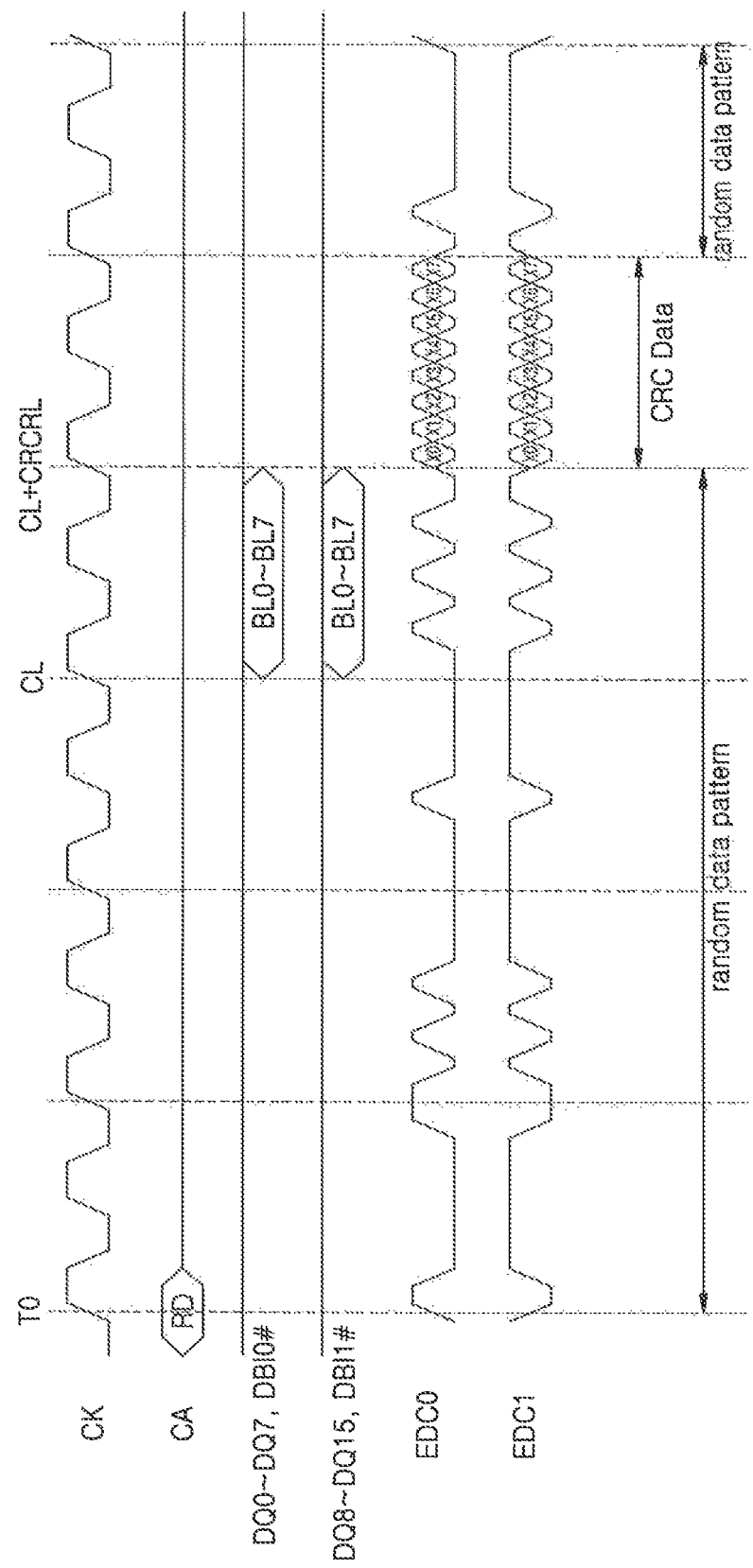

According to an embodiment, the detection clock pattern generator 122 inverts a random data pattern of the detection clock output signal DC in response to the fourth control signal EDC_INV provided by the mode register 121 of FIG. 1. A detection clock output signal DC that is output from the detection clock pattern generator 122 to the first and second EDC pins EDC0 and EDC1 may be random data patterns inverted from each other, as shown in FIG. 15B, Alternatively, a detection clock output signal DC that is output from the detection clock pattern generator 122 to the first and second EDC pins EDC0 and EDC1 may be different random data patterns, as shown in FIG. 15C.

FIGS. 16 and 17A to 17D are diagrams illustrating a graphics memory system 1600 including a memory device according to an exemplary embodiment of the inventive concept.

Figure 16:
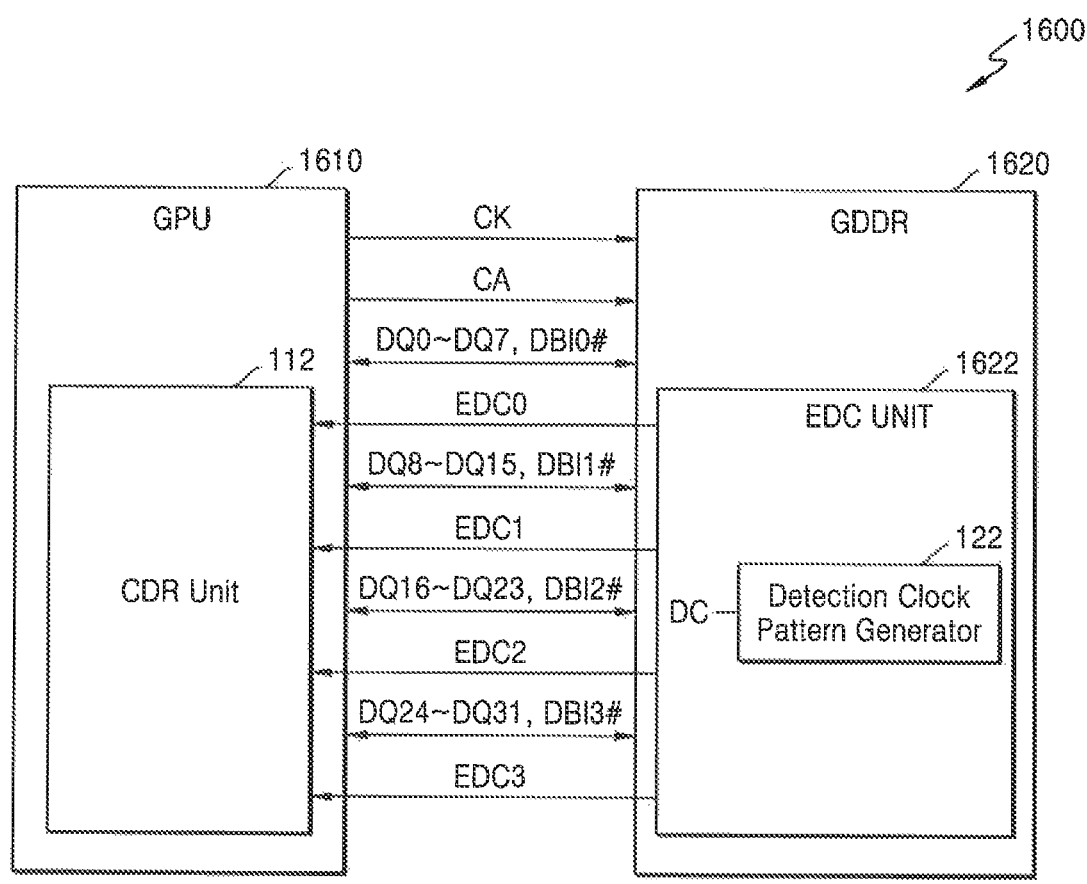

The graphics memory system 1600 of FIG. 16 differs from the graphics memory system 1400 of FIG. 14 in that an EDC unit 1622 (e.g., an EDC circuit) is connected to first to fourth EDC pins EDC0 to EDC3, but the rest of the components in the graphics memory system 1600 of FIG. 16 are almost identical to those of the graphics memory system 1400 of FIG. 14. The graphics memory system 1600 includes a GPU 1610 and a GDDR 1620 (e.g., a DRAM). Hereinafter, differences between the graphics memory system 1600 of FIG. 16 and the graphics memory system 1400 of FIG. 14 will be mainly described.

Figure 17A:
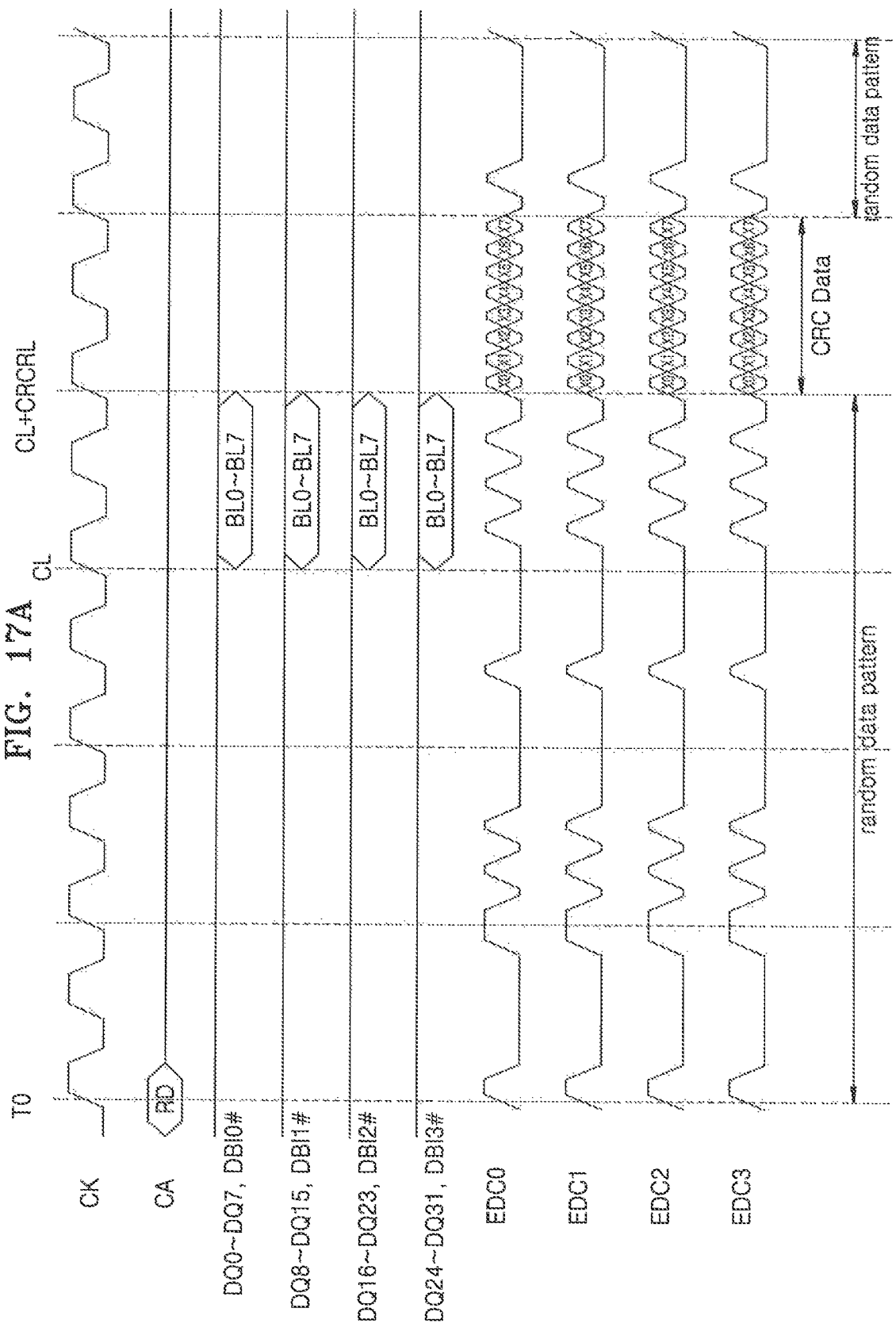

Referring to FIGS. 16 and 17A, the EDC unit 1622 calculates CRC data X0 to X7 for data BL0 to BL7 of a first EDC group including DQ0 to DC 7 pins and a DBI0# pin and provides the calculated CRC data X0 to X7 to a GPU 1610 via the first EDC pin EDC0. The EDC unit 1422 calculates CRC data X0 to X7 for data BL0 to BL7 of a second EDC group including DQ8 to DQ15 pins and a DBI1# pin and provides the calculated CRC data X0 to X7 to the GPU 1610 via the second EDC pin EDC1. The EDC unit 1422 calculates CRC data X0 to X7 for data BL0 to BL7 of a third EDC group including DQ16 to DQ23 pins and a DBI2# pin and provides the calculated CRC data X0 to X7 to the GPU 1610 via the third EDC pin EDC2. The EDC unit 1422 calculates CRC data X0 to X7 for data BL0 to BL7 of a fourth EDC group including DQ24 to DQ31 pins and a DBI3# pin and provides the calculated CRC data X0 to X7 to the GPU 1610 via the fourth EDC pin EDC3.

The EDC unit 1622 includes a detection clock pattern generator 122. The EDC unit 1622 may output a detection clock output signal DC including random data patterns generated by the detection clock pattern generator 122 to the first to fourth EDC pins EDC0 to EDC3 in a clocking mode. The detection clock output signal. DC may be output to each of the first to fourth EDC pins EDC0 to EDC3 identically.

Figure 17B:
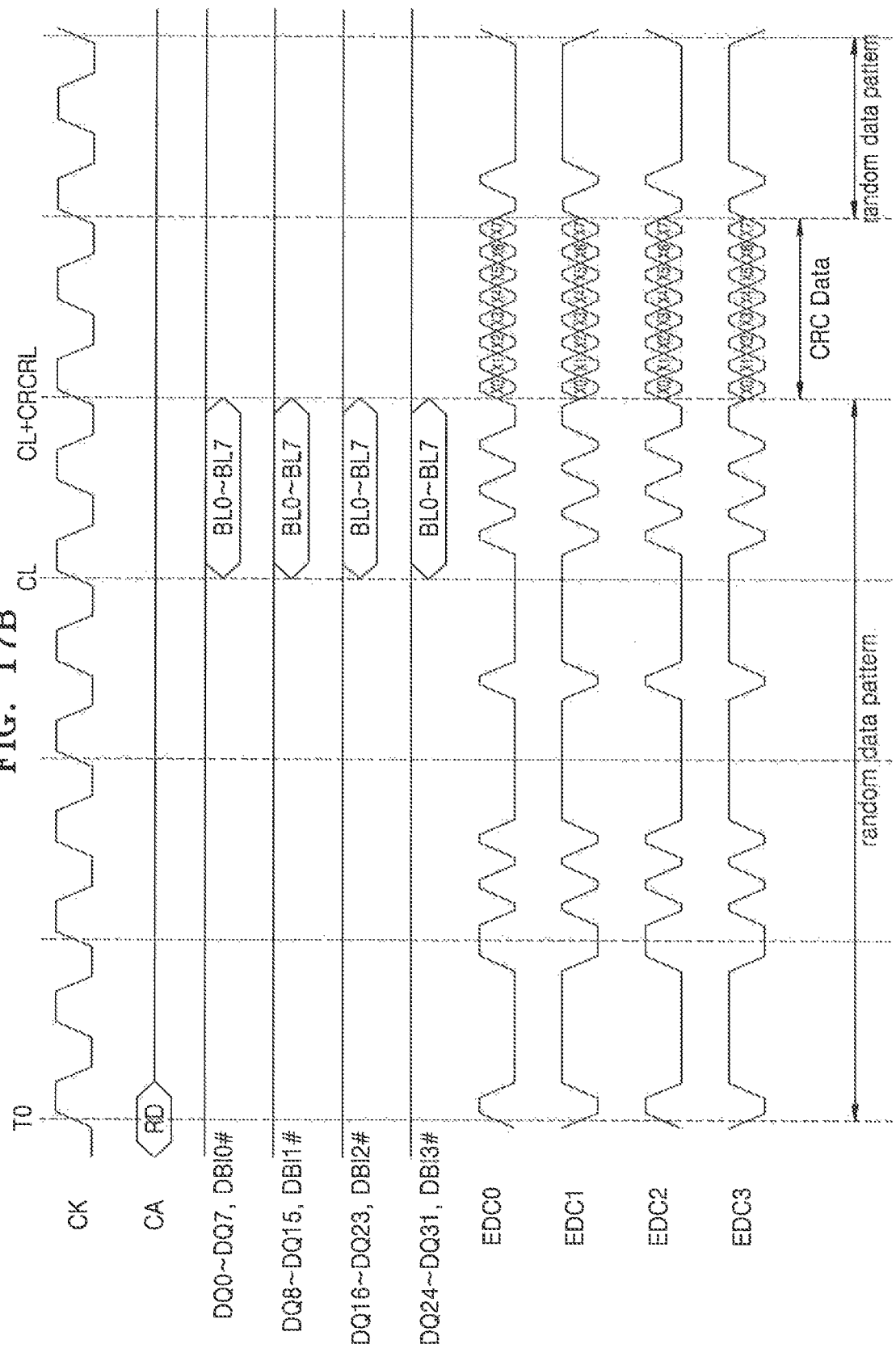

According to an embodiment, the detection clock pattern generator 122 inverts a random data pattern of the detection clock output signal DC in response to the fourth control signal EDC_INV provided by the mode register 121 of FIG. 1. As shown in FIG. 17B, the detection clock pattern generator 122 outputs a detection clock output signal DC, which is output to the first and third EDC pins EDC0 and EDC2, as the same random data pattern, outputs a detection clock output signal DC, which is output to the first and second EDC pins EDC0 and EDC1, as random data patterns inverted from each other, and outputs a detection clock output signal DC, which is output to the third and fourth EDC pins EDC2 and EDC3, as random data patterns inverted from each other.

According to an embodiment, as shown in FIG. 17C, the detection clock pattern generator 122 outputs a detection clock output signal DC, which is output to the first and third EDC pins EDC0 and EDC2, as different random data patterns, outputs a detection clock output signal DC, which is output to the first and second EDC pins EDC0 and EDC1, as random data patterns inverted from each other, and outputs a detection clock output signal DC, which is output to the third and fourth EDC pins EDC2 and EDC3, as random data patterns inverted from each other.

According to an embodiment, as shown in. FIG. 17D, the detection clock pattern generator 122 outputs a detection clock output signal DC, which is output to the first to fourth EDC pins EDC0 to EDC3, as different random data patterns.

Figure 18:
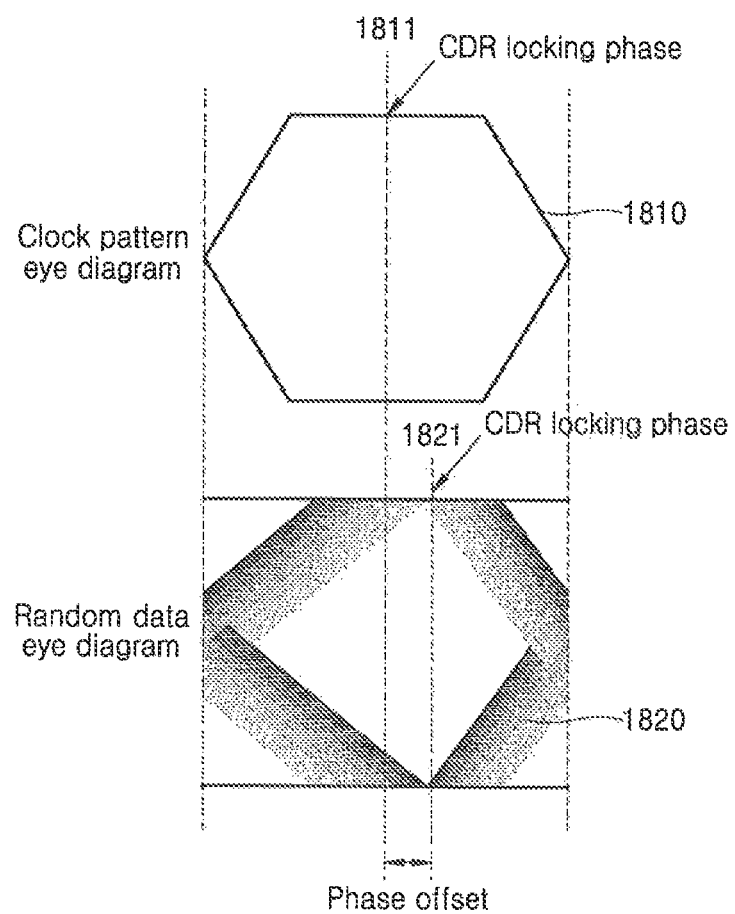
FIG. 18 shows a data eye pattern when a detection clock output signal including a random data pattern is used for a clock data recovery operation, according to an exemplary embodiment of the inventive concept.

FIG. 18 shows a data eye pattern when a detection clock output signal including a random data pattern is used for a clock data recovery operation, according to an exemplary embodiment of the inventive concept.

For reference, in a data interface between the controller 110 and the memory device 120 described with reference to FIG. 1, the CDR unit 112 may use a detection clock output signal DC including random data patterns, transmitted from the memory device 120, to perform a clock data recovery operation.

Referring to FIG. 18, a random data eye diagram 1820 of a detection clock output signal DC including a random data pattern is illustrated in FIG. 18. The random data eye diagram 1820 is shown as a superposition of a number of data transitions representing jitter due to noise and may be provided to the CDR unit 112 of FIG. 1 as a waveform distorted by the circumstances of a channel through which data is transmitted.

When the detection clock output signal DC is provided as a clock pattern, an eye diagram 1810 of the clock pattern may have a symmetrical eye opening area and a maximum eye, compared to the random data eye diagram 1820. The CDR unit 112 may perform a clock data recovery operation by adjusting and locking a phase so that the edge of the clock signal is in the middle 1811 of the eye diagram 1810 of the clock pattern.

However, in the clock data recovery operation of the CDR unit 112, a signal that actually needs to lock the phase is preferably data transmitted in real time rather than a clock pattern. The data transmitted in real time may include a random data pattern. When the CDR unit 112 performs the clock data recovery operation by using the detection clock output signal DC including the random data pattern, the phase of the clock signal may be locked so that the edge of the clock signal is in the middle 1821 of the random data eye diagram 1820. This phase locking causes the CDR unit 112 to perform the clock data recovery operation with a CDR locking phase 1821 for actual data. Accordingly, it may be beneficial to the CDR unit 112 to use a detection clock output signal DC including a random data pattern rather than a detection clock output signal DC including a clock pattern to reduce a phase offset and reduce a locking time.

While the inventive concept has been particularly shown and described with reference to embodiments thereof, it will be understood that various changes in form and details may be made therein without departing from the spirit and scope of the inventive concept.

What is claimed:

1. A memory device comprising:
   an output pin;
   a mode register; and
   a signal generator configured to generate a detection clock output signal including one of a random data pattern and a hold data pattern in response to a first control signal and a second control signal from the mode register, and output the detection clock output signal through the output pin, wherein the random data pattern includes pseudo-random data generated by the memory device, wherein the hold data pattern is a fixed pattern pre-stored in the memory device, and wherein the detection clock output signal is used for a clock data recovery operation,
   wherein the signal generator outputs the detection clock output signal through the output pin at one of a first rate and a second rate different from the first rate based on a third control signal output from the mode register.

2. The memory device of claim 1, wherein the detection clock output signal includes the random data pattern when the first control signal is a first logic level and the second control signal is a second other logic level, and the detection clock output signal includes the hold data pattern when the first control signal is the second logic level and the second control signal is the first logic level.

3. The memory device of claim 1, wherein the second rate is $1/2^N$ times the first rate, where N is a positive integer $<=1$.

4. The memory device of claim 1, wherein the signal generator is further configured to generate an error detection code in response to a fourth control signal output from the mode register, and output the error detection code through the output pin at one of the first rate and the second rate based on the third control signal, wherein the detection clock output signal is output during a first time period and the error detection code is output during a second time period after the first time period.

5. The memory device of claim 4, wherein the signal generator is further configured to invert the detection clock output signal for output through the output pin in response to a fifth control signal output from the mode register.

6. The memory device of claim 5, wherein the signal generator is further configured to generate a command address signal for output through the output pin in response to a sixth control signal.

7. The memory device of claim 6, wherein the signal generator is further configured to generate a read data strobe in response to a seventh control signal output from the mode register, and output the read data strobe through the output pin, wherein the read data strobe is used by a device external to the memory device to latch read data output from the memory device.

8. The memory device of claim 1, wherein the signal generator comprises:
   a pseudo random bit sequence generator configured to generate a plurality of random bit signals in response to a first clock signal;
   a logic circuit configured to receive the random bit signals and selectively perform an exclusive-OR operation on the random bit signals to generate a plurality of logic output signals;
   a first pattern selector configured to receive one of the random bit signals and the logic output signals as first inputs and output some of the first inputs as a plurality of pattern signals in response to the first clock signal; and
   a second pattern selector configured to receive the pattern signals as second inputs and output one of the second inputs to the output pin as the detection clock output signal in response to second clock signals, wherein a clock cycle of the second clock signals is half a clock cycle of the first clock signal.

9. The memory device of claim 3, wherein the signal generator comprises:
   a pseudo random bit sequence generator configured to generate a plurality of random bit signals in response to a first clock signal; a logic circuit configured to receive the random bit signals and generate a plurality of logic switching signals in response to the third control signal;
   a first pattern selector configured to receive the logic switching signals as first inputs and output some of the first inputs as a plurality of pattern signals in response to the first clock signal; and
   a second pattern selector configured to receive the pattern signals as second inputs and output one of the second inputs as the detection clock output signal in response to second clock signals, wherein a clock cycle of the second clock signals is half a clock cycle of the first clock signal.

10. A memory device comprising:
an output pin;
a mode register; and
a signal generator configured to generate training data comprising a random data pattern in response to a first control signal output from the mode register during a first mode, and output the training data through the output pin at one of a first rate and a second rate different from the first rate based on a second control signal output from the mode register,
wherein the random data pattern includes pseudo-random data generated by the memory device, and
wherein the training data is used for a clock and data recovery operation.

11. The memory device of claim 10, wherein the second rate is $1/2^N$ times the first rate, where N is a positive integer $\geq 1$.

12. The memory device of claim 10, wherein the signal generator is configured to generate the training data including a hold data pattern during a second mode in response to a third control signal from the mode register, where the hold data pattern is a fixed pattern pre-stored in the memory device.

13. The memory device of claim 11, wherein the signal generator is further configured to generate an error detection code in response to a third control signal output from the mode register, and output the error detection code through the output pin at one of the first rate and the second rate based on the second control signal, wherein the training data is output during a first time period and the error detection code is output during a second time period after the first time period.

14. The memory device of claim 13, wherein the signal generator is further configured to invert the training data for output through the output pin in response to a fourth control signal output from the mode register.

15. The memory device of claim 14, wherein the signal generator is further configured to generate a read data strobe in response to a fifth control signal output from the mode register, and output the read data strobe through the output pin, wherein the read data strobe is used by a device external to the memory device to latch read data output from the memory device.

16. The memory device of claim 10, wherein the signal generator comprises:
a pseudo random bit sequence generator configured to generate a plurality of random bit signals in response to a first clock signal;
a logic circuit configured to receive the random bit signals and selectively perform an exclusive-OR operation on the random bit signals to generate a plurality of logic output signals;
a first pattern selector configured to receive one of the random bit signals and the logic output signals as first inputs and output some of the first inputs as a plurality of pattern signals in response to the first clock signal; and
a second pattern selector configured to receive the pattern signals as second inputs and output one of the second inputs to the output pin as the training data in response to second clock signals, wherein a clock cycle of the second clock signals is half a clock cycle of the first clock signal.

17. The memory device of claim 10, wherein the signal generator comprises:
a pseudo random bit sequence generator configured to generate a plurality of random bit signals in response to a first clock signal;
a logic circuit configured to receive the random bit signals and generate a plurality of logic switching signals in response to the second control signal; a first pattern selector configured to receive the logic switching signals as first inputs and output some of the first inputs as a plurality of pattern signals in response to the first clock signal; and
a second pattern selector configured to receive the pattern signals as second inputs and output one of the second inputs as the training data in response to second clock signals, wherein a clock cycle of the second clock signals is half a clock cycle of the first clock signal.

18. A memory device comprising:
a first error detection code (EDC) pin;
a second EDC pin;
a signal generator configured to output a first detection clock signal comprising a first random data pattern through the first EDC pin and output a second detection clock signal comprising a second random data pattern through the second EDC pin, during a first period; calculate first cyclic redundancy check (CRC) data based on first data; calculate second CRC data based on second data; and output the first CRC data through the first EDC pin and the second CRC data through the second EDC pin, during a second period after the first period, wherein the first and second random data patterns include pseudo-random data generated by the memory device, and wherein the random data patterns are used for a clock data recovery operation,
wherein the signal generator outputs the detection clock output signals through the EDC pins at one of a first rate and a second rate different from the first rate based on a control signal output from a mode register of the memory device.

19. The memory device of claim 18, further comprising a first group of data pins for communicating the first data and a second group of data pins for communicating the second data.

* * * * *